US008363462B2

(12) United States Patent
Nagase et al.

(10) Patent No.: US 8,363,462 B2
(45) Date of Patent: Jan. 29, 2013

(54) MAGNETORESISTIVE ELEMENT

(75) Inventors: Toshihiko Nagase, Sagamihara (JP);
Masatoshi Yoshikawa, Yokohama (JP);
Eiji Kitagawa, Sagamihara (JP);
Masahiko Nakayama, Fuchu (JP);
Tadashi Kai, Tokyo (JP); Tatsuya Kishi, Yokohama (JP); Hiroaki Yoda, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/233,906

(22) Filed: Sep. 15, 2011

(65) Prior Publication Data
US 2012/0008381 A1 Jan. 12, 2012

Related U.S. Application Data

(63) Continuation of application No. 12/686,168, filed on Jan. 12, 2010, now Pat. No. 8,036,025, which is a continuation of application No. 11/534,440, filed on Sep. 22, 2006, now Pat. No. 7,663,197.

(30) Foreign Application Priority Data

Oct. 19, 2005 (JP) ................................ 2005-305088
Jun. 22, 2006 (JP) ................................ 2006-172845

(51) Int. Cl.
G11C 11/15 (2006.01)
(52) U.S. Cl. ................. 365/158; 257/421; 257/E29.323
(58) Field of Classification Search .............. 235/493;
257/421, E29.323; 365/158
See application file for complete search history.

(56) References Cited

U.S. PATENT DOCUMENTS

| 6,101,072 | A | 8/2000 | Hayashi |
| 6,847,547 | B2 | 1/2005 | Albert et al. |
| 7,190,613 | B2 | 3/2007 | Nagase et al. |
| 7,274,080 | B1 | 9/2007 | Parkin |
| 7,285,836 | B2 * | 10/2007 | Ju et al. ........................ 257/421 |
| 7,355,824 | B2 * | 4/2008 | Nishiyama et al. ...... 360/324.11 |
| 7,408,749 | B2 | 8/2008 | Gill |
| 7,468,541 | B2 * | 12/2008 | Fukuzumi ..................... 257/421 |
| 7,596,015 | B2 | 9/2009 | Kitagawa et al. |
| 7,920,361 | B2 | 4/2011 | Yoshikawa et al. |
| 2005/0105328 | A1 * | 5/2005 | Ho ................................. 365/158 |
| 2006/0262594 | A1 * | 11/2006 | Fukumoto ...................... 365/158 |

(Continued)

FOREIGN PATENT DOCUMENTS

JP 8-186022 7/1996
JP 2000-260010 9/2000

(Continued)

OTHER PUBLICATIONS

T. Ikeda et al., "GMR and TMR Films Using GdFe Alloy with Perpendicular Magnetization," Journal of the Magnetics Society of Japan, vol. 24, No. 4-2, 2000, pp. 563-566.

(Continued)

Primary Examiner — Allan R Wilson
(74) Attorney, Agent, or Firm — Oblon, Spivak, McClelland, Maier & Neustadt, L.L.P.

(57) ABSTRACT

A magnetoresistive element which records information by supplying spin-polarized electrons to a magnetic material, includes a first pinned layer which is made of a magnetic material and has a first magnetization directed in a direction perpendicular to a film surface, a free layer which is made of a magnetic material and has a second magnetization directed in the direction perpendicular to the film surface, the direction of the second magnetization reversing by the spin-polarized electrons, and a first nonmagnetic layer which is provided between the first pinned layer and the free layer. A saturation magnetization Ms of the free layer satisfies a relationship $0 \leq Ms < \sqrt{\{Jw/(6\pi At)\}}$. Jw is a write current density, t is a thickness of the free layer, A is a constant.

23 Claims, 14 Drawing Sheets

U.S. PATENT DOCUMENTS

| | | |
|---|---|---|
| 2007/0096229 A1 | 5/2007 | Yoshikawa et al. |
| 2007/0111332 A1 | 5/2007 | Zhao et al. |
| 2008/0182342 A1 | 7/2008 | Parkin |
| 2008/0291585 A1 | 11/2008 | Yoshikawa et al. |
| 2009/0079018 A1 | 3/2009 | Nagase et al. |
| 2009/0080239 A1 | 3/2009 | Nagase et al. |
| 2009/0096045 A1 | 4/2009 | Hayakawa et al. |
| 2009/0243008 A1 | 10/2009 | Kitagawa et al. |
| 2009/0251951 A1 | 10/2009 | Yoshikawa et al. |
| 2010/0034014 A1 | 2/2010 | Ohno et al. |
| 2010/0315864 A1 | 12/2010 | Ueda et al. |
| 2011/0073970 A1 | 3/2011 | Kai et al. |

FOREIGN PATENT DOCUMENTS

| | | |
|---|---|---|
| JP | 2001-291911 | 10/2001 |
| JP | 2002-110938 | 4/2002 |
| JP | 2002-280638 | 9/2002 |
| JP | 2003-162806 | 6/2003 |
| JP | 2003-174214 | 6/2003 |
| JP | 2005-19464 | 1/2005 |
| JP | 2005-109263 | 4/2005 |
| JP | 2005-150482 | 6/2005 |
| JP | 2005-203702 | 7/2005 |
| WO | WO 2005/083714 | 9/2005 |
| WO | WO 2005/088745 | 9/2005 |

OTHER PUBLICATIONS

Naoki Nishimura et al., "Magnetic tunnel junction device with perpendicular magnetization films for high-density magnetic random access memory," Journal of Applied Physics, vol. 91, No. 8, Apr. 15, 2002, pp. 5246-5249.

J.C. Slonczewski, "Current-driven excitation of magnetic multilayers," Journal of Magnetism and Magnetic Materials 159, 1996, pp. L1-L7.

K. Yagami et al., "Low-current spin-transfer switching and its thermal durability in a low-saturation-magnetization nanomagnet," Applied Physics Letters, vol. 85, No. 23, Dec. 6, 2004, pp. 5634-5636.

"Handbook of Magnetic Material," Japan, Asakura Publishing Co., Ltd., New Edition, Apr. 1, 2006, p. 304.

Office Action issued Jul. 5, 2011 in Japanese Application No. 2008-163742 (w/English translation).

Japanese Office Action issued Mar. 6, 2012, in Japan Patent Application No. 2008-163742 (with English translation).

* cited by examiner

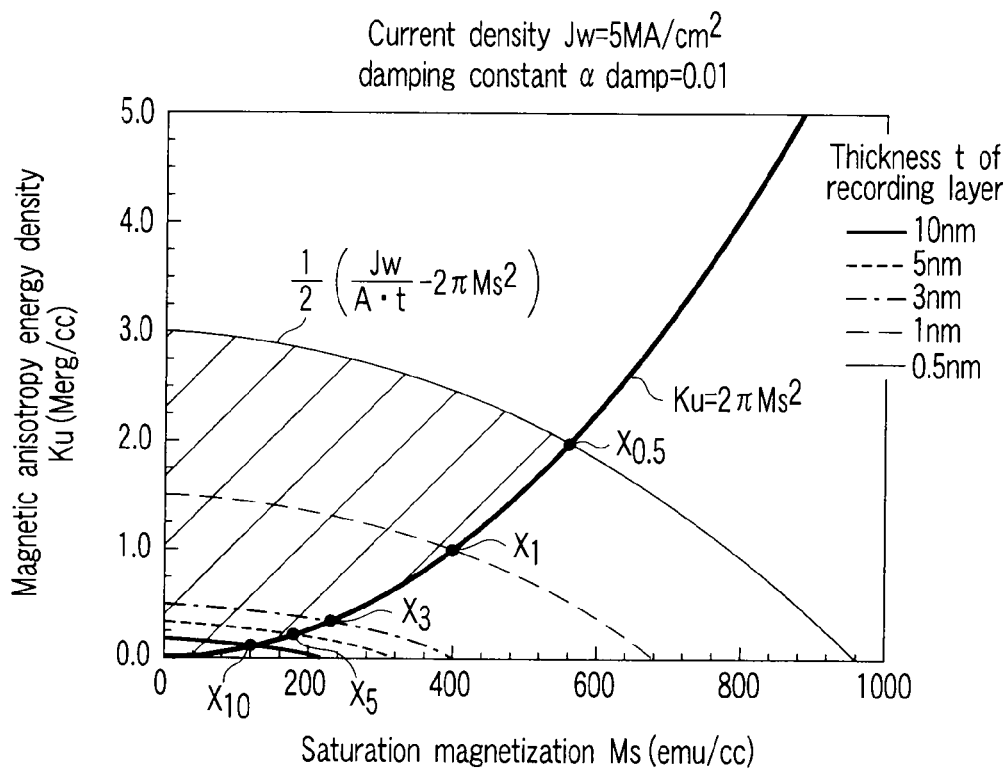
F I G. 13A
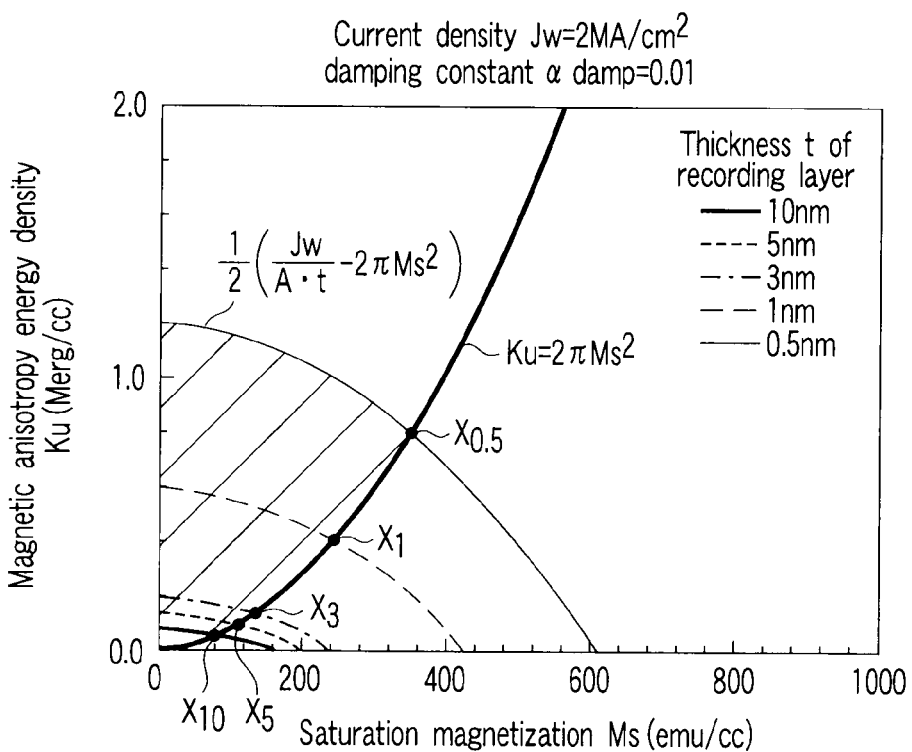
F I G. 13B

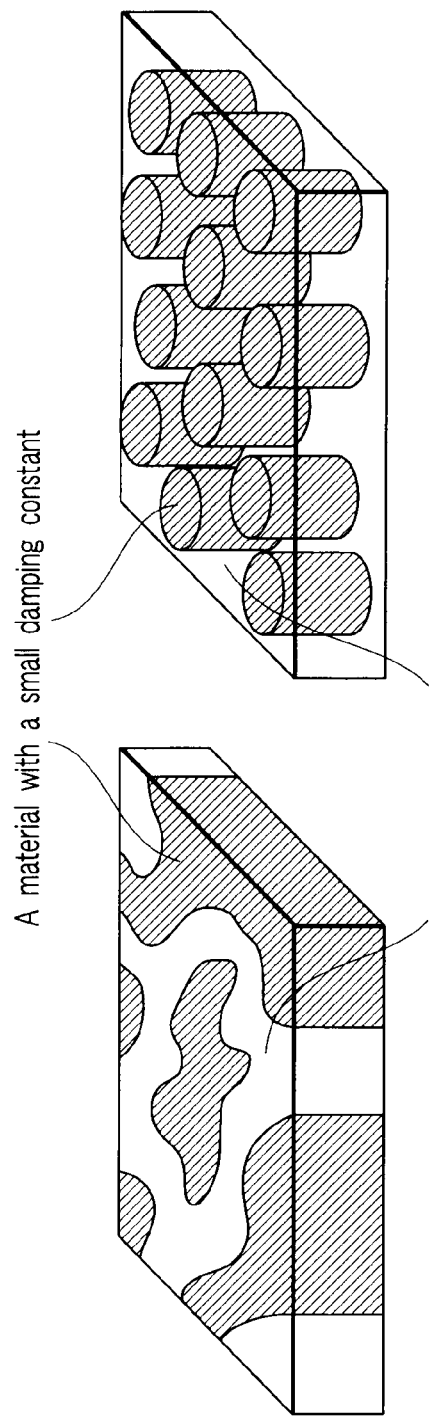
FIG. 16A
FIG. 16B
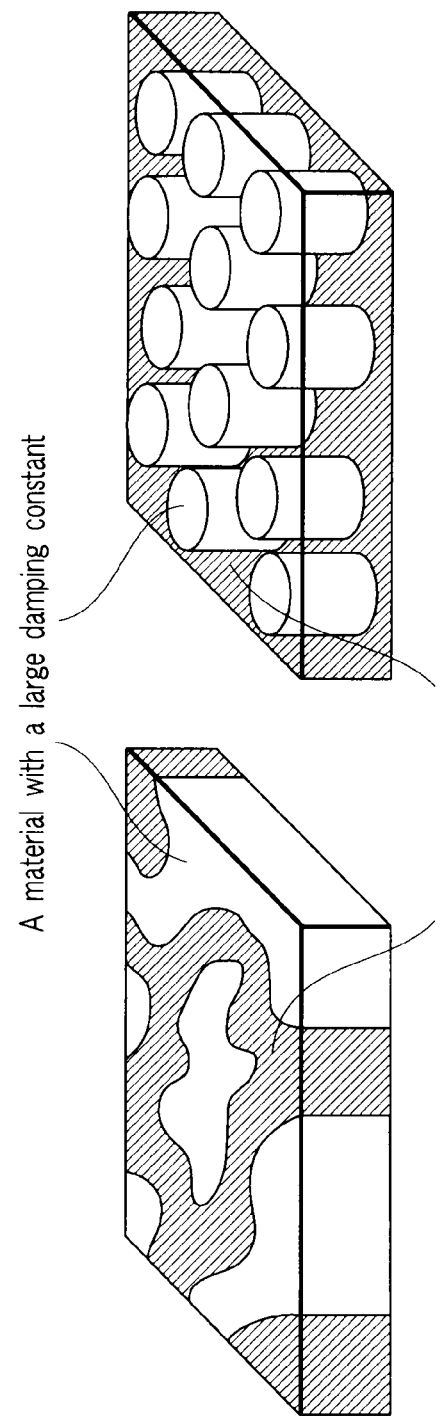
FIG. 16C
FIG. 16D

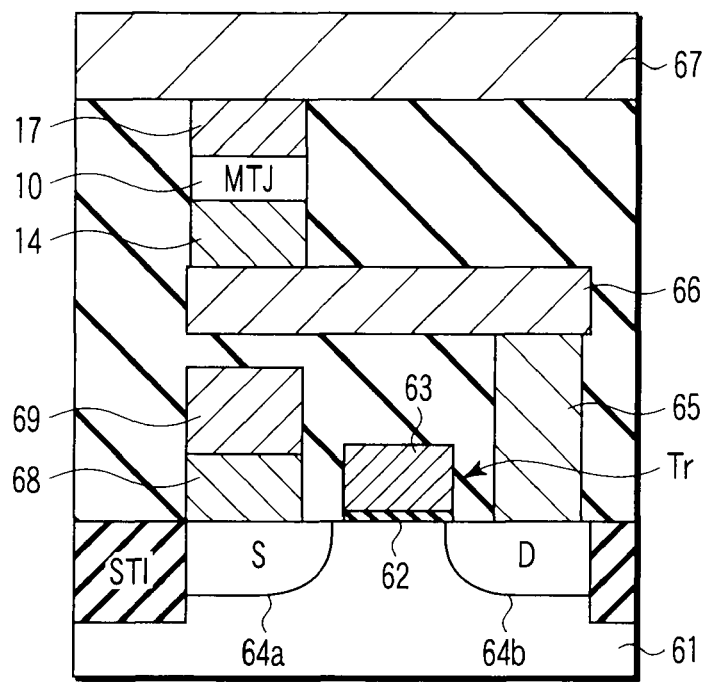
F I G. 17
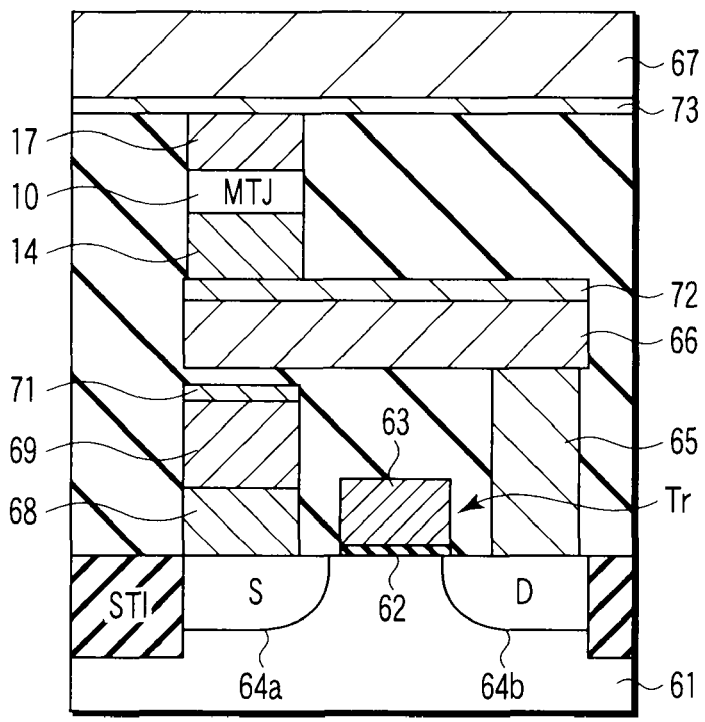
F I G. 18

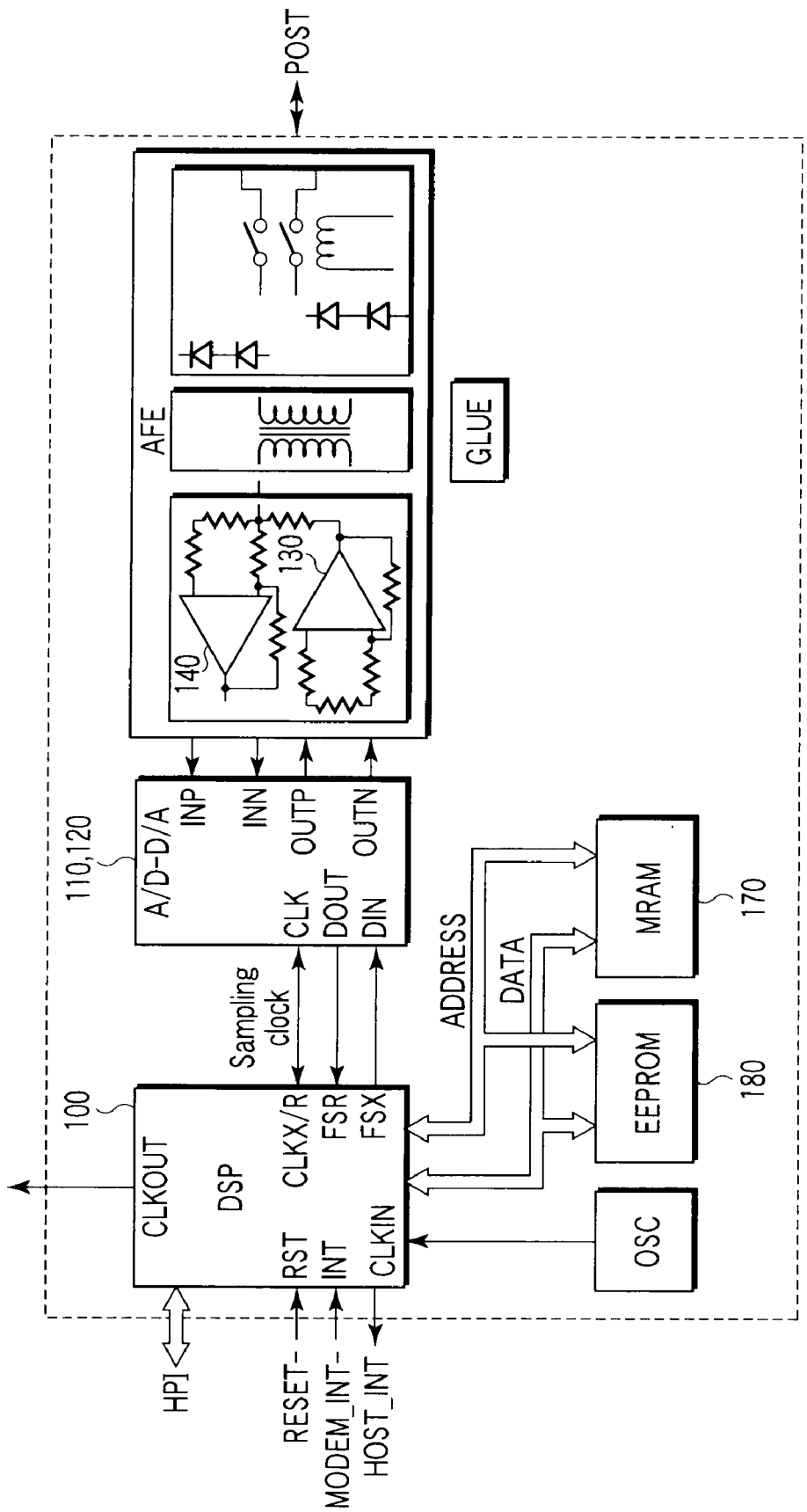
F I G. 19

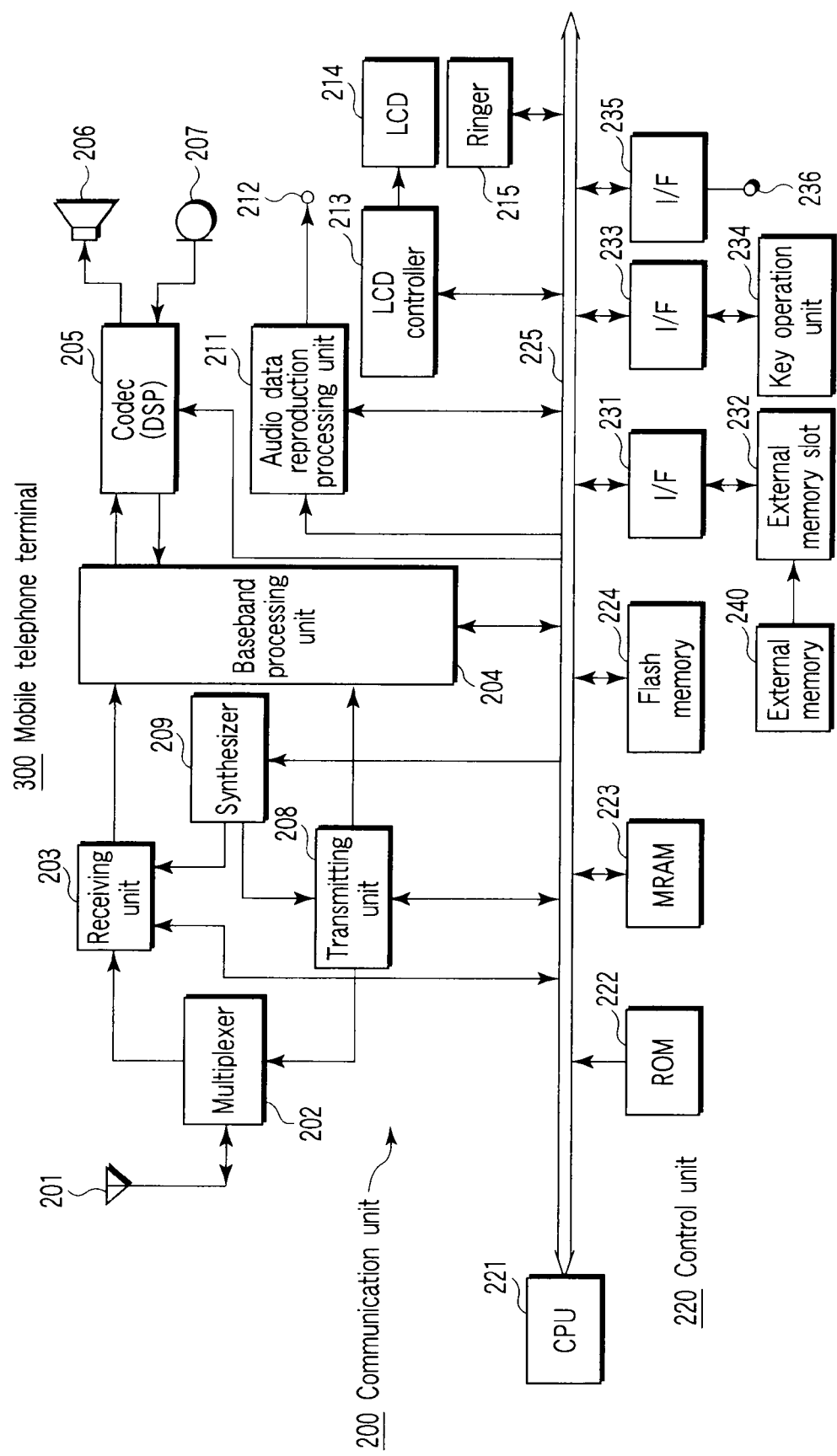
F I G. 20

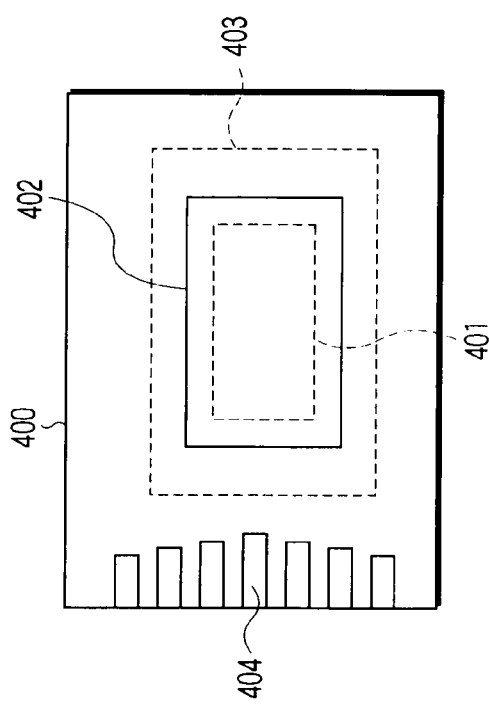
F I G. 21
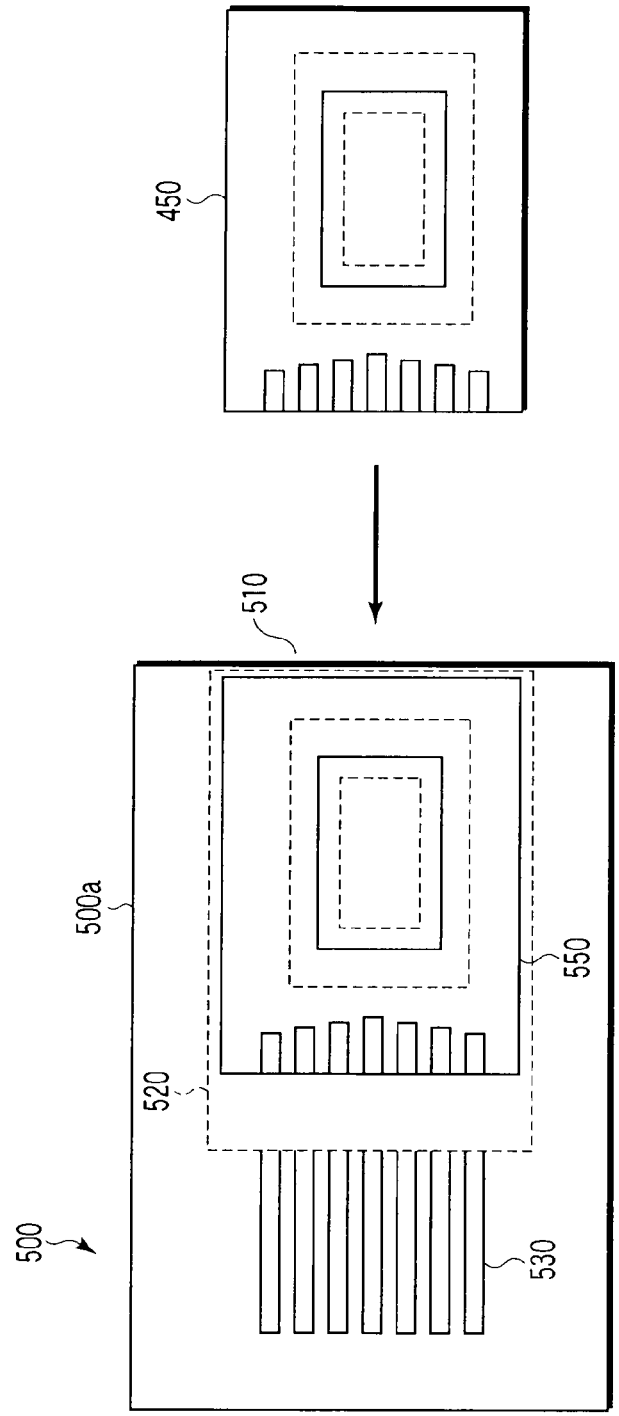
F I G. 22

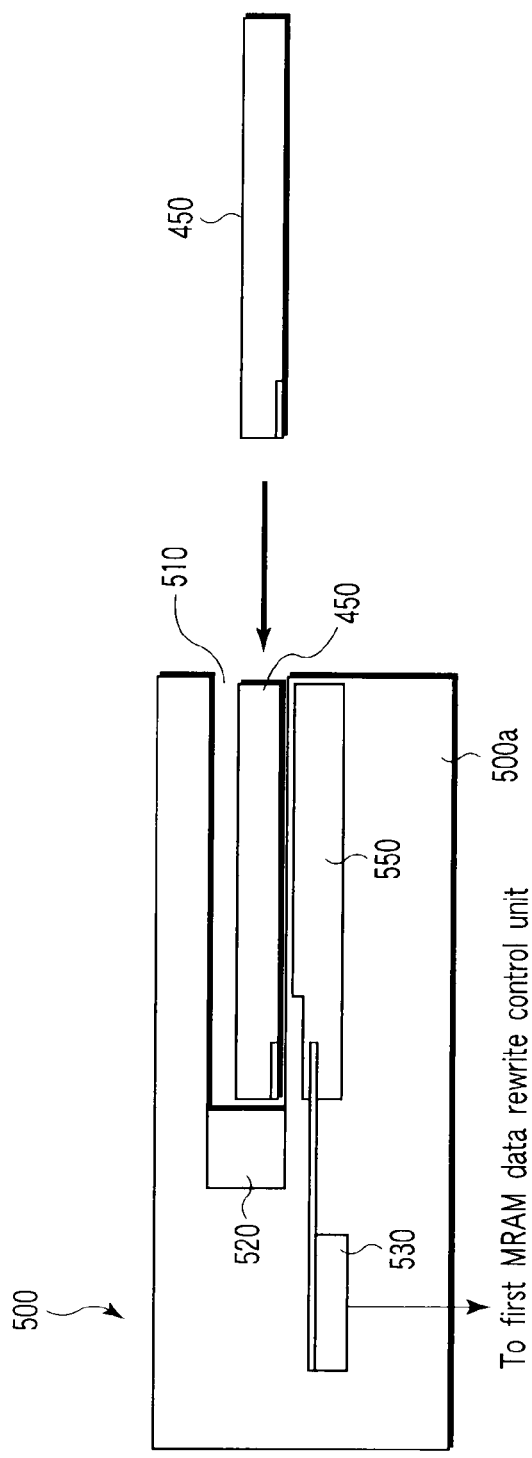
F I G. 23
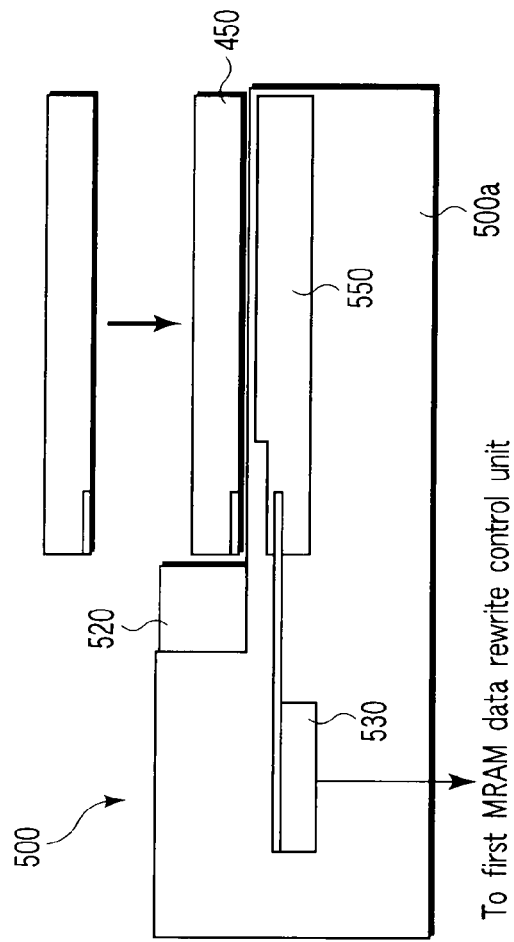
F I G. 24

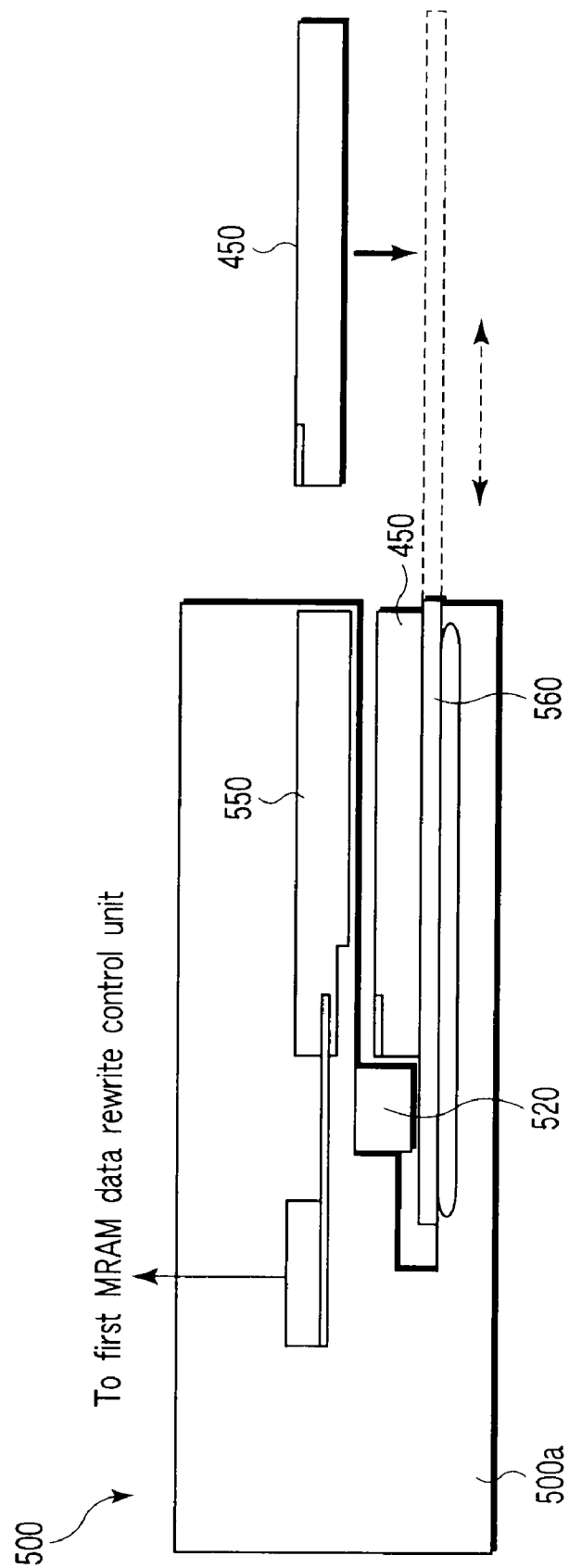
F I G. 25

MAGNETORESISTIVE ELEMENT

CROSS-REFERENCE TO RELATED APPLICATIONS

This application is a continuation of and claims the benefit of priority under 35 U.S.C. §120 from U.S. Ser. No. 12/686,168 filed Jan. 12, 2010, which is a continuation of U.S. Ser. No. 11/534,440 (now U.S. Pat. No. 7,663,197 issued Feb. 16, 2010), which claims the benefit of priority under 35 U.S.C. §119 from Japanese Patent Applications No. 2005-305088 filed Oct. 19, 2005 and No. 2006-172845 filed Jun. 22, 2006, the entire contents of each of which are incorporated herein by reference.

BACKGROUND OF THE INVENTION

1. Field of the Invention

The present invention relates to a magnetoresistive element, a magnetoresistive random access memory (MRAM), and an electronic card and electronic device using the same.

2. Description of the Related Art

A magnetoresistive random access memory (MRAM) using a tunneling magnetoresistive (TMR) effect is characterized in storing data in accordance with the magnetization state of a magnetic tunnel junction (MTJ) element. In order to get the magnetoresistive random access memory into practical use, various kinds of techniques have been proposed.

For example, a yoke wiring structure is proposed to reduce a write current. As the structure of an MTJ element, a structure using a perpendicular magnetic film made of a GdFe alloy (e.g., nonpatent reference 1) and a layered structure using a perpendicular magnetic film (e.g., nonpatent reference 2) are proposed. They basically employ a field write scheme of reversing the magnetization direction of a magnetic layer by using a magnetic field generated by a current. When the current is large, a large magnetic field can be generated. However, as microfabrication progresses, the current that can be supplied to the wiring is limited. By realizing the reduction of the distance between the wiring and the magnetic layer and/or the yoke structure to concentrate the generated magnetic field, the current value necessary for reversing the magnetic material can be reduced. However, since the magnetic field necessary for magnetization reversal of the magnetic material increases along with the progress of microfabrication, it is very difficult to simultaneously implement both current reduction and microfabrication. The magnetic field necessary for magnetization reversal of the magnetic material is increased by microfabrication because a magnetic energy to overcome thermal agitation is required. The magnetic energy can be made high by increasing the magnetic anisotropy energy density and the volume of the magnetic material. Since the volume is decreased by microfabrication, a shape magnetic anisotropy energy or magnetocrystalline anisotropy energy is used in general. However, since an increase in magnetic energy of the magnetic material leads to an increase in reversal field, as described above, it is very hard to implement both current reduction and microfabrication simultaneously. Patent reference 1 proposes a yoke structure of completely closed magnetic circuit type which introduces a perpendicular magnetic film with a high magnetocrystalline anisotropy energy and has an ultimately high current magnetic field generation efficiency. Since this yoke structure becomes large relative to the magnetic element, the cell area becomes relatively large so all the microfabrication, current reduction, and cell area reduction cannot be satisfied.

In recent years, magnetization reversal by a spin polarized current is theoretically predicted and also confirmed by experiments. A magnetoresistive random access memory using a spin polarized current is proposed (e.g., nonpatent reference 3). According to this scheme, the magnetization of a magnetic material can be reversed only by flowing a spin polarized current to the magnetic material. When the volume of the magnetic material is small, the amount of spin-polarized electrons to be injected can also be small. This scheme is therefore expected to implement both microfabrication and current reduction. In addition, since no magnetic field generated by a current is used, no yoke structure to increase the magnetic field is necessary, and the cell area can be reduced. In the magnetization reversal scheme using a spin polarized current, however, the problem of thermal agitation still rises along with the progress of microfabrication. To overcome thermal agitation, the magnetic anisotropy energy density must be increased, as described above. An in-plane magnetization structure mainly examined until now generally uses shape magnetic anisotropy. In this case, magnetic anisotropy is ensured by using the shape. For this reason, the reversal current is sensitive to the cell shape, and a variation in reversal current increases as microfabrication progresses. Since the aspect ratio of an MTJ cell must be at least 1.5, the cell size also increases. When an in-plane magnetization structure using not shape magnetic anisotropy but magnetocrystalline anisotropy uses a material having a high magnetocrystalline anisotropy energy density (e.g., a Co—Cr alloy material used in a hard disk medium), the easy axis is largely dispersed in plane. Hence, reduction of the magnetoresistive (MR) effect and incoherent precession are induced, resulting in an increase in reversal current.

There are reported several examples of a perpendicular magnetic MTJ structure, as described above, although no detailed means to form a large-scale array by the write scheme using a spin polarized current has been proposed.

As described above, the conventional magnetoresistive random access memory preferably simultaneously reduces the write current, overcomes the thermal agitation, and reduces the cell area. However, this is very difficult in the write scheme using a magnetic field generated by a current. Even in the conventional write scheme using a spin polarized current, no detailed means is proposed to overcome the thermal agitation that becomes apparent along with the progress of microfabrication.

[Patent Reference 1] Jpn. Pat. Appln. KOKAI Publication No. 2005-19464

[Nonpatent Reference 1] Ikeda, et al., "GMR film and TMR film using GdFe alloy perpendicular magnetic film", JOURNAL OF MAGNETIC SOCIETY OF JAPAN, Vol. 24, No. 4-2, 2000, pp. 563-566

[Nonpatent Reference 2] N. Nishimura, et al., "Magnetic tunnel junction device with perpendicular magnetization films for high-density magnetic random access memory", JOURNAL OF APPLIED PHYSICS, Vol. 91, No. 8, 15 April, 2002

[Nonpatent Reference 3] J. C. Slonczewski, et al., "Current-driven excitation of magnetic multilayers", JOURNAL OF MAGNETISM AND MAGNETIC MATERIALS, Vol. 159, No. 1-2, L1-7, 1996

[Nonpatent Reference 4] K. Yagami, et al., "Low-current spin-transfer switching and its thermal durability in a low-saturation-magnetization nanomagnet", APPLIED PHYSICS LETTERS, Vol. 85, No. 23, pp. 5634-5636, 2004

BRIEF SUMMARY OF THE INVENTION

According to a first aspect of the present invention, there is provided a magnetoresistive element which records information by supplying spin-polarized electrons to a magnetic material, comprising: a first pinned layer which is made of a magnetic material and has a first magnetization directed in a direction perpendicular to a film surface; a free layer which is made of a magnetic material and has a second magnetization directed in the direction perpendicular to the film surface, the direction of the second magnetization reversing by the spin-polarized electrons; and a first nonmagnetic layer which is provided between the first pinned layer and the free layer, wherein a saturation magnetization Ms of the free layer satisfies a relationship $0 \leq Ms < \sqrt{\{Jw/(6\pi At)\}}$, where Jw is a write current density, t is a thickness of the free layer, A is a constant which is $g' \times e \cdot \alpha/(h/2\pi \times g)$, g' is a g-factor, e is an elementary charge, $\alpha$ is a Gilbert's damping constant, h is a Planck's constant, and g is a spin transfer efficiency when the first magnetization and second magnetization are arranged parallel.

According to a second aspect of the present invention, there is provided a magnetoresistive element which records information by supplying spin-polarized electrons to a magnetic material, comprising: a first pinned layer which is made of a magnetic material and has a first magnetization directed in a direction perpendicular to a film surface; a free layer which is made of a magnetic material and has a second magnetization directed in the direction perpendicular to the film surface, the direction of the second magnetization reversing by the spin-polarized electrons; a first nonmagnetic layer which is provided between the first pinned layer and the free layer; a first magnetic metal layer which is provided between the first pinned layer and the first nonmagnetic layer and contains at least one element selected from the group consisting of Fe, Co, and Ni; and a second magnetic metal layer which is provided between the free layer and the first nonmagnetic layer and contains at least one element selected from the group consisting of Fe, Co, and Ni.

According to a third aspect of the present invention, there is provided a magnetoresistive element which records information by supplying spin-polarized electrons to a magnetic material, comprising: a first pinned layer which is made of a magnetic material and has a first magnetization directed in a direction perpendicular to a film surface; a free layer which is made of a magnetic material and has a second magnetization directed in the direction perpendicular to the film surface, the direction of the second magnetization reversing by the spin-polarized electrons; a second pinned layer which is made of a magnetic material and has a third magnetization directed in the direction perpendicular to the film surface; a first nonmagnetic layer which is provided between the first pinned layer and the free layer; and a second nonmagnetic layer which is provided between the second pinned layer and the free layer.

According to a fourth aspect of the present invention, there is provided a magnetoresistive random access memory comprising: a magnetoresistive element of any one of the first to third aspects; and a write wiring which gives a current of the spin-polarized electrons to the magnetoresistive element.

According to a fifth aspect of the present invention, there is provided a magnetoresistive random access memory comprising: a magnetoresistive element of any one of the first to third aspects; a write wiring which gives a current of the spin-polarized electrons to the magnetoresistive element; and a soft magnetic film which covers at least part of the write wiring and absorbs a magnetic field leaked from the magnetoresistive element.

According to a sixth aspect of the present invention, there is provided a magnetoresistive random access memory comprising: a magnetoresistive element of any one of the first to third aspects; a write wiring which gives a current of the spin-polarized electrons to the magnetoresistive element; and a first soft magnetic film and a second soft magnetic film which sandwich the magnetoresistive element from a direction of thickness and absorbs a magnetic field leaked from the magnetoresistive element.

According to a seventh aspect of the present invention, there is provided an electronic card comprising: a semiconductor chip having a magnetoresistive element of any one of the first to third aspects; a card portion which stores the semiconductor chip and has a window to expose the semiconductor chip; a shutter which opens/closes the window and is made of a material having a magnetic shielding effect; and a terminal which is provided in the card portion to electrically connect the semiconductor chip to an outside of the card portion.

According to an eighth aspect of the present invention, there is provided an electronic device comprising: a storage portion which stores an electronic card of the seventh aspect; and a terminal which is provided in the storage portion and electrically connected to the electronic card to supply a signal which controls a data rewrite of the electronic card.

BRIEF DESCRIPTION OF THE SEVERAL VIEWS OF THE DRAWING

FIGS. 13A and 13B are graphs showing the relationship (damping constant=0.01) between the free layer thickness, saturation magnetization, and magnetic anisotropy energy according to an embodiment of the present invention;

FIGS. 16A to 16D are schematic views showing forms in which a material with a small damping constant or a material with a large damping constant is dispersed according to an embodiment of the present invention;

FIG. 17 is a schematic sectional view showing a magnetoresistive random access memory according to the first embodiment of the present invention;

FIG. 18 is a schematic sectional view showing a magnetoresistive random access memory according to the second embodiment of the present invention;

FIG. 19 is a block diagram showing Application Example 1 which applies a magnetoresistive random access memory according to an embodiment of the present invention to a modem;

FIG. 20 is a block diagram showing Application Example 2 which applies a magnetoresistive random access memory according to an embodiment of the present invention to a cellular phone terminal;

FIG. 21 is a plan view showing Application Example 3 which applies a magnetoresistive random access memory according to an embodiment of the present invention to an MRAM card to store media contents;

FIG. 22 is a plan view showing a card insertion type data transfer device to transfer data to the MRAM card in FIG. 21;

FIG. 23 is a sectional view showing the card insertion type data transfer device to transfer data to the MRAM card in FIG. 21;

FIG. 24 is a sectional view showing a fitting type data transfer device to transfer data to the MRAM card in FIG. 21; and FIG. 25 is a sectional view showing a slide type data transfer device to transfer data to the MRAM card in FIG. 21.

DETAILED DESCRIPTION OF THE INVENTION

Figure 1A:
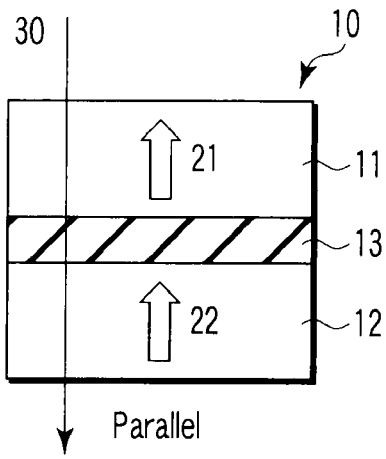
FIGS. 1A and 1B are schematic views showing an MTJ element with a single pin structure according to an embodiment of the present invention.

The embodiments of the present invention will be described below with reference to the accompanying drawing. In the following description, the same reference numerals denote the same parts throughout the drawing.

[1] MTJ Element

In an example of the present invention, a magnetic tunnel junction (MTJ) element is used as a magnetoresistive element.

[1-1] Single Pin Structure

Figure 1B:
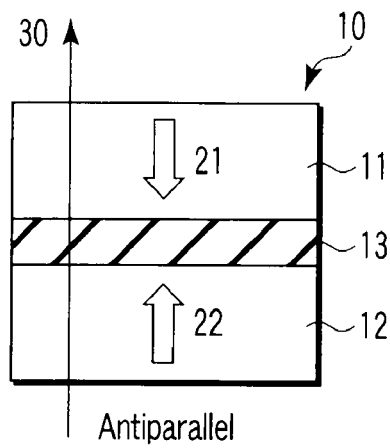

FIGS. 1A and 1B are schematic views showing an MTJ element with a single pin structure according to an embodiment of the present invention. The MTJ element with a single pin structure according to an embodiment of the present invention will be described below.

As shown in FIGS. 1A and 1B, an MTJ element 10 has a layered structure including a free layer (recording layer) 11 formed from a magnetic layer, a pinned layer (fixed magnetic layer) 12 formed from a magnetic layer, and a nonmagnetic layer 13 sandwiched between the free layer 11 and the pinned layer 12. The MTJ element 10 is of so-called perpendicular magnetization type in which a magnetization direction 21 of the free layer 11 and a magnetization direction 22 of the pinned layer 12 are perpendicular to the film surface.

When the nonmagnetic layer 13 is made of an insulator, the MTJ element 10 has a tunneling magnetoresistive (TMR) effect. When the nonmagnetic layer 13 is made of a metal, the MTJ element 10 has a giant magnetoresistive (GMR) effect. The nonmagnetic layer 13 made of an insulator uses, e.g., MgO (magnesium oxide) or AlO (aluminum oxide; e.g., $Al_2O_3$). The nonmagnetic layer 13 made of a metal uses, e.g., Cu, Pt or Au.

(Operation)

In the MTJ element 10 of perpendicular magnetization type, the magnetizations of the two magnetic layers (free layer 11 and pinned layer 12) are arranged parallel (FIG. 1A) or antiparallel (FIG. 1B). The resistance value which changes depending on the magnetization arrangement state corresponds to "0" or "1" information. A spin polarized current 30 is supplied to the MTJ element 10 to change the magnetization direction 21 of the free layer 11 and write information. Spin-polarized electrons flow in a reverse direction to the spin polarized current 30.

More specifically, when the spin polarized current 30 flows from the free layer 11 to the pinned layer 12, as shown in FIG. 1A, the spin-polarized electrons are injected from the pinned layer 12 to the free layer 11 so that the magnetization direction 22 of the pinned layer 12 and the magnetization direction 21 of the free layer 11 are arranged parallel. On the other hand, when the spin polarized current 30 flows from the pinned layer 12 to the free layer 11, as shown in FIG. 1B, the spin-polarized electrons flow from the free layer 11 to the pinned layer 12. Electrons having spin parallel to the pinned layer 12 are transmitted. Electrons having spin antiparallel to the pinned layer 12 are reflected. As a result, the magnetization direction 21 of the free layer 11 and the magnetization direction 22 of the pinned layer 12 are arranged antiparallel.

(Magnetic Materials)

When a magnetic layer with a large reversal current is used as the pinned layer 12, and a magnetic layer with a reversal current smaller than that of the pinned layer 12 is used as the free layer 11, a high-performance MTJ element 10 can be implemented. When magnetization reversal is caused by the spin polarized current 30, the reversal current is proportional to saturation magnetization, anisotropy field, and volume. By appropriately adjusting them, the difference in reversal current between the free layer 11 and the pinned layer 12 can be ensured.

As the magnetic material of the free layer 11 and pinned layer 12 to implement perpendicular magnetization, a material having a high magnetocrystalline anisotropy energy density of, e.g., $5 \times 10^5$ erg/cc or more is preferably used. Detailed examples will be described below.

(1) Disordered Alloys

Alloys having Co as a principal component and containing at least one element of Cr, Ta, Nb, V, W, Hf, Ti, Zr, Pt, Pd, Fe, and Ni. Examples are a CoCr alloy, CoPt alloy, CoCrTa alloy, CoCrPt alloy, CoCrPtTa alloy, and CoCrNb alloy. These alloys can adjust the magnetic anisotropy energy density and saturation magnetization by increasing the ratio of the nonmagnetic element.

(2) Ordered Alloys

Ordered alloys containing at least one element of Fe, Co, and Ni and at least one element of Pt and Pd and having an $L1_0$ crystal structure. Examples are $Fe_{50}Pt_{50}$, $Fe_{50}Pd_{50}$, $CO_{50}Pt_{50}$, $Fe_{30}Ni_{20}Pt_{50}$, $CO_{30}Fe_{20}Pt_{50}$, and $CO_{30}Ni_{20}Pt_{50}$. These ordered alloys are not limited to the above composition ratios. When an impurity element such as Cu (copper), Cr, or Ag (silver), an alloy thereof, or an insulator is added to these ordered alloys, the magnetic anisotropy energy density and saturation magnetization can be adjusted low.

(3) Artificial Lattices

Structures in which one element of Fe, Co, and Ni or an alloy containing at least one of them and one element of Cr, Pt, Pd, Ir, Rh, Ru, Os, Re, Au, and Cu or an alloy containing at least one of them are alternately stacked. Examples are a Co/Pt artificial lattice, Co/Pd artificial lattice, CoCr/Pt artificial lattice, Co/Ru artificial lattice, and Co/Os, Co/Au, and Ni/Cu artificial lattices. These artificial lattices can adjust the magnetic anisotropy energy density and saturation magnetization by adjusting element doping in the magnetic layer and the thickness ratio between the magnetic layer and the nonmagnetic layer.

(4) Ferrimagnetic Materials

Ferrimagnetic materials made of alloys of rare-earth metals and transition metals. Examples are amorphous alloys made of Tb (terbium), Dy (dysprosium), or Gd (gadolinium), and at least one element of transition metals. Examples are TbFe, TbCo, TbFeCo, DyTbFeCo, and GdTbCo. These alloys can adjust the magnetic anisotropy energy density and saturation magnetization by adjusting the composition.

In the magnetic layer, the magnetic and nonmagnetic portions may be separated by segregating the nonmagnetic portion. For example, an oxide such as $SiO_2$ or MgO, a nitride such as SiN, or a carbide such as SiC may be used as the nonmagnetic portion. Alternatively, an alloy such as a nonmagnetic CoCr alloy with a Cr concentration of 25 at % or more may be used.

A magnetic metal layer made of a highly spin-polarized material, i.e., at least one element of Fe, Co, and Ni or an alloy containing the element may be arranged on the interface between the magnetic layer (free layer 11 or pinned layer 12) and the nonmagnetic layer 13 of the MTJ element 10 to increase the magnetoresistive (MR) ratio. Since the magnetic layers normally have in-plane magnetization as a monolayer, the magnetic thickness ratio to the stacked perpendicular magnetic anisotropy material must be adjusted not to deteriorate the stability of perpendicular magnetization.

The free layer 11 and pinned layer 12 may have a structure including stacked magnetic layers. One of the magnetic layers may be a so-called granular structure in which a magnetic material is dispersed.

(Effects)

In the MTJ element 10 with a single pin structure according to an embodiment of the present invention, to direct the magnetization directions 21 and 22 of the free layer 11 and pinned layer 12 in the direction perpendicular to the film surface, magnetic anisotropy in the perpendicular direction is necessary. When the magnetic anisotropy depends on the magnetocrystalline anisotropy, it does not depend on the shape. Even when the pattern size of the magnetic film is small, the anisotropy field does not change. Hence, microfabrication can be implemented without increasing the reversal current density only when the magnetic film is formed as a perpendicular magnetic film.

As described above, the reversal current density does not increase even when the MTJ element 10 is microfabricated. For this reason, a large-capacity (e.g., 256 Mbits or more) magnetoresistive random access memory (MRAM) having the MTJ element 10 of 90 nm or less can be implemented, although it is impossible in a conventional MRAM.

Detailed examples of the MTJ element 10 with the single pin structure will be described below.

(a) Detailed Example 1-1

In an MTJ element 10 of Detailed Example 1-1, a free layer 11 is made of an artificial lattice, and a pinned layer 12 is made of an ordered alloy.

Figure 2:
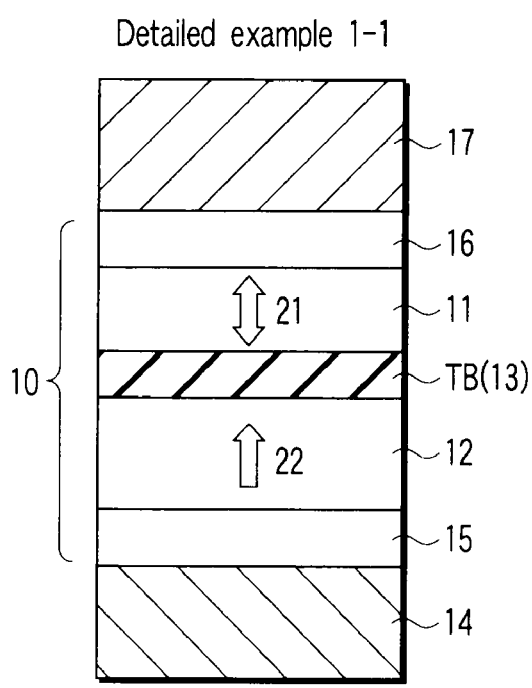
FIG. 2 is a schematic sectional view showing Detailed Example 1-1 of the MTJ element according to an embodiment of the present invention.

FIG. 2 is a schematic sectional view showing Detailed Example 1-1 of the MTJ element according to an embodiment of the present invention. Detailed Example 1-1 of the MTJ element 10 will be described below.

As shown in FIG. 2, the MTJ element 10 has a structure in which an underlayer 15, pinned layer 12, tunnel barrier layer TB (nonmagnetic layer 13), free layer 11, and cap layer 16 are stacked in an order named. The underlayer 15 is used to improve the crystalline orientation of MTJ. A lower electrode 14 is provided on the lower surface of the underlayer 15. An upper electrode 17 is provided on the upper surface of the cap layer 16.

The pinned layer 12 needs to have a magnetization reversal current larger than that of the free layer 11, and for this, saturation magnetization, anisotropy field, and thickness are adjusted, as described above. To obtain perpendicular magnetic anisotropy when, e.g., an FePt or CoPt ordered alloy is used as the pinned layer 12, a (001) plane with a face centered tetragonal (fct) structure must be oriented. For this purpose, a very thin underlayer having a thickness of several nm and made of MgO (magnesium oxide) is used as the underlayer 15. As the underlayer 15, an element or compound, e.g., an alloy having a face centered cubic (fcc) structure or body centered cubic (bcc) structure with a lattice constant of about 2.8 Å, 4 Å, or 5.6 Å, e.g., Pt, Pd, Ag, Au, Al, or Cr or an alloy mainly containing them may be used.

The magnetization reversal current of the free layer 11 must be smaller than that of the pinned layer 12. Saturation magnetization, anisotropy field, and thickness are adjusted, as described above, to make the current smaller than that of the pinned layer 12. When, e.g., a Co/Pt artificial lattice is used, the coercive force can be adjusted by adjusting the thickness of the Co and Pt.

The layered structure of Detailed Example 1-1 of the MTJ element 10 will be described below. The lower electrode 14 is made of a 10-nm thick Ta film. The underlayer 15 is made of a 3-nm thick Pt film formed on a 0.5-nm thick MgO film. The MgO/Pt layered film has a (001) plane oriented. The pinned layer 12 is made of a 10-nm thick $Fe_{50}Pt_{50}$ film with a (001) plane being oriented. The tunnel barrier layer TB is made of a 1.5-nm thick MgO film. The free layer 11 is made of a layered film of [Co/Pt]5 formed by stacking five periods each including a 0.45-nm thick Co film and a 1.5-nm thick Pt film. The cap layer 16 is made of a 3-nm thick Pt film. The upper electrode 17 is made of a layered film having a 10-nm thick Ru film formed on a 10-nm thick Ta film.

In the MTJ element 10 according to Detailed Example 1-1, the coercive force and saturation magnetization are measured by using a vibrating sample magnetometer. The coercive force and saturation magnetization are 5 kOe and 700 emu/cc in the pinned layer 12 and 130 Oe and 340 emu/cc in the free layer 11.

A Pt layer may be inserted in the interface between the tunnel barrier layer TB and Co of the free layer 11 unless the MR ratio decreases largely. As the pinned layer 12, e.g., a $CO_{50}Pt_{50}$ ordered layer or $CO_{30}Fe_{20}Pt_{50}$ ordered layer may be used in place of the above-described $Fe_{50}Pt_{50}$ ordered layer. As the pinned layer 12, e.g., $(Fe_{50}Pt_{50})_{88}$—$(SiO_2)_{12}$ may be used which is a structure formed by dividing the above-described structure by, e.g., $SiO_2$ or MgO. As the free layer 11, a Co/Pd artificial lattice may be used in place of the Co/Pt artificial lattice. As the tunnel barrier layer TB, Al—O may be used.

The stack order of the free layer 11 and pinned layer 12 may be reversed. In this case, the MTJ element 10 has the following layered structure. The lower electrode 14 is made of a 10-nm thick Ta film. The underlayer 15 is made of a 3-nm thick Pt film formed on a 0.5-nm thick MgO film. The free layer 11 is made of a [Co/Pt]4/Co artificial lattice formed by stacking five each including a 0.3-nm thick Co film and a 1.5-nm thick Pt film. By the underlayer 15, Pt of the artificial lattice is oriented to a (001) plane. The tunnel barrier layer TB is made of a 1.5-nm thick MgO film and oriented to a (001) plane reflecting the orientation of the artificial lattice of the free layer 11. The pinned layer 12 is made of a 10-nm thick $Fe_{50}Pt_{50}$ film whose (001) plane is oriented reflecting the MgO (001) plane. The cap layer 16 is made of a 3-nm thick Pt film. The upper electrode 17 is made of a layered film having a 10-nm thick Ru film formed on a 10-nm thick Ta film. Even in this stack order, the coercive forces and saturation magnetizations of the free layer 11 and pinned layer 12 exhibit the same values as described above. In this case, since $Fe_{50}Pt_{50}$ is used as the pinned layer 12, MgO with a (001) plane being oriented is particularly preferable as the tunnel barrier layer TB. The artificial lattice [Co/Pt]4/Co as the free layer 11 need not always be oriented to the (001) plane. It may be oriented to a (111) plane. In this case, the (111) plane of Pt can be oriented by, e.g., forming the underlayer 15 made of a 5-nm thick Pt film on the lower electrode 14 made of a 10-nm thick Ta film. To orient MgO of the tunnel barrier layer TB on the free layer 11 to the (001) plane, an artificial lattice [Co/Pt]4/$CO_{60}Fe_{20}B_{20}$ is used by forming a 0.5-nm thick $CO_{60}Fe_2O_{20}$ film instead of Co of the [Co/Pt]4/Co artificial lattice as the free layer 11 on the interface side of the tunnel barrier layer TB.

To fix the pinned layer 12 in one direction, an antiferromagnetic layer may be provided adjacent. As the antiferromagnetic layer, an alloy of Mn and Fe, Ni, Pt, Pd, Ru, Os, or Ir, i.e., FeMn, NiMn, PtMn, PdMn, PtPdMn, RuMn, OsMn, IrMn, or CrPtMn can be used.

(b) Detailed Example 1-2

An MTJ element 10 of Detailed Example 1-2 is a modification of Detailed Example 1-1. A highly spin-polarized layer is formed on each of the interface between a tunnel barrier layer TB and a free layer 11 and the interface between the tunnel barrier layer TB and a pinned layer 12.

Figure 3:
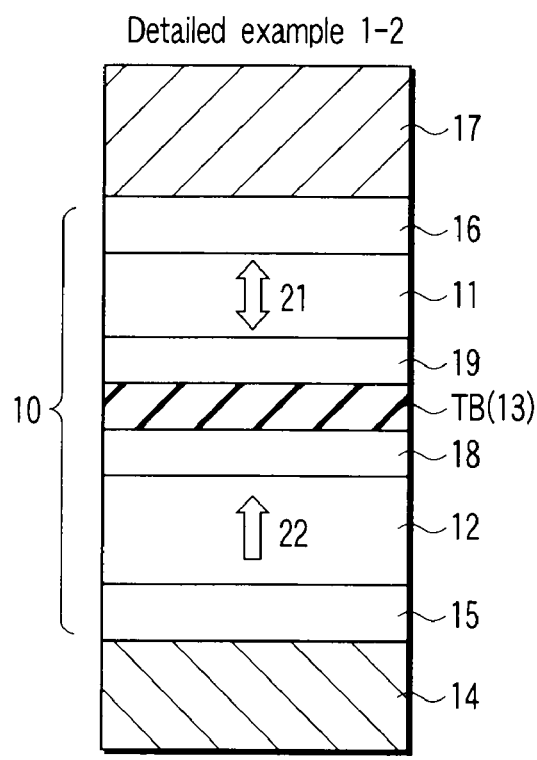
FIG. 3 is a schematic sectional view showing Detailed Example 1-2 of the MTJ element according to an embodiment of the present invention.

FIG. 3 is a schematic sectional view showing Detailed Example 1-2 of the MTJ element according to an embodiment of the present invention. Detailed Example 1-2 of the MTJ element 10 will be described below.

As shown in FIG. 3, in the MTJ element 10 of Detailed Example 1-2, a first highly spin-polarized layer 18 is provided on the interface between a pinned layer 12 and a tunnel barrier layer TB. A second highly spin-polarized layer 19 is provided on the interface between a free layer 11 and the tunnel barrier layer TB. The first highly spin-polarized layer 18 is exchange-coupled to the pinned layer 12. The second highly spin-polarized layer 19 is exchange-coupled to the free layer 11. The second highly spin-polarized layer 19 is preferably thinner than the first highly spin-polarized layer 18 to reverse the free layer 11 at a lower current density than the pinned layer 12. The magnetic thickness represented by the product of the volume and saturation magnetization Ms is preferably made less in the free layer 11 than in the pinned layer 12. For this purpose, preferably, the saturation magnetization Ms is reduced, the film thickness is reduced, or the magnetic anisotropy energy is reduced.

Each of the first and second highly spin-polarized layers 18 and 19 is formed from a magnetic metal layer containing at least one element of, e.g., Fe, Co, and Ni. At least one of the first and second highly spin-polarized layers 18 and 19 may be made of a ferromagnetic alloy which contains at least one element of Fe, Co, Ni and at least one element of B, Nb, Zr, Ta, V, and W and has a bcc crystal structure.

The layered structure of Detailed Example 1-2 of the MTJ element 10 will be described below. A lower electrode 14 is made of a 10-nm thick Ta film. An underlayer 15 is made of a 3-nm thick Pt film formed on a 0.5-nm thick MgO film. The MgO/Pt layered film has a (001) plane oriented. The pinned layer 12 is made of a 15-nm thick $CO_{50}Pt_{50}$ film with a (001) plane being oriented. The first highly spin-polarized layer 18 is made of a 1.5-nm thick $CO_{62}Fe_{22}B_{16}$ film. The tunnel barrier layer TB is made of a 1.5-nm thick MgO film. The second highly spin-polarized layer 19 is made of a 1.0-nm thick $CO_{62}Fe_{22}B_{16}$ film. The free layer 11 is made of a layered film of [Pd/Co]4 formed by stacking four periods each including a 0.7-nm thick Pd film and a 0.3-nm thick Co film. A cap layer 16 is made of a 3-nm thick Pd film. An upper electrode 17 is made of a layered film having a 10-nm thick Ru film formed on a 10-nm thick Ta film.

In the MTJ element 10 according to Detailed Example 1-2, the coercive force and saturation magnetization are measured by using a vibrating sample magnetometer. The coercive force and saturation magnetization are 3.5 kOe and 750 emu/cc in the pinned layer 12 and 250 Oe and 500 emu/cc in the free layer 11. The pinned layer 12 and first highly spin-polarized layer 18 are exchange-coupled and behave as one magnetic layer. The free layer 11 and second highly spin-polarized layer 19 are exchange-coupled and behave as one magnetic layer. Hence, the above-described coercive forces and saturation magnetizations are values obtained when the layers are regarded as single magnetic materials. By contribution of the highly spin-polarized layers 18 and 19, the magnetoresistive ratio of the MTJ element 10 is 120%.

As the pinned layer 12, e.g., $(CO_{50}Pt_{50})_{90}$—$(MgO)_{10}$ may be used which is a structure formed by dividing the above-described structure by, e.g., $SiO_2$ or MgO. As the free layer 11, a CoCr/Pd artificial lattice may be used in place of the Co/Pd artificial lattice. As the tunnel barrier layer TB, Al—O may be used. The stack order of the free layer 11 and pinned layer 12 may be reversed. To fix the pinned layer 12 in one direction, an antiferromagnetic layer may be provided adjacent. As the antiferromagnetic layer, an alloy of Mn and Fe, Ni, Pt, Pd, Ru, Os, or Ir, i.e., FeMn, NiMn, PtMn, PdMn, PtPdMn, RuMn, OsMn, IrMn, or CrPtMn can be used.

(c) Detailed Example 1-3

An MTJ element 10 of Detailed Example 1-3 has the same layered structure as that of Detailed Example 1-2 shown in FIG. 3. A highly spin-polarized layer is provided on each of the interface between a tunnel barrier layer TB and a free layer 11 and the interface between the tunnel barrier layer TB and a pinned layer 12. Each highly spin-polarized layer is made of Co, Fe, a Co—Fe alloy, and an Fe—Ni alloy which are stacked with the (001) plane of a bcc structure oriented. An $L1_0$ ordered alloy with a (001) plane being oriented is also stacked. The $L1_0$ ordered alloy may be either the free layer or the pinned layer.

The layered structure of Detailed Example 1-3 of the MTJ element 10 will be described below. A lower electrode 14 is made of a 10-nm thick Ta film. An underlayer 15 is made of a 3-nm thick Pt film formed on a 0.5-nm thick MgO film. The MgO/Pt layered film has a (001) plane oriented. The pinned layer 12 is made of a 15-nm thick $Fe_{50}Pt_{50}$ film with a (001) plane being oriented. A first highly spin-polarized layer 18 is made of a 1.0-nm thick Fe film. Fe has the (001) plane of a bcc structure oriented. The tunnel barrier layer TB is made of a 1.5-nm thick MgO film with a (001) plane being oriented. A second highly spin-polarized layer 19 is made of a 0.5-nm thick $CO_{50}Fe_{50}$ film. $CO_{50}Fe_{50}$ has the (001) plane of a bcc structure oriented. The free layer 11 is made of a layered film of [Co/Pt]4 formed by stacking four periods each including a 0.7-nm thick Pd film and a 0.3-nm thick Co film. A cap layer 16 is made of a 3-nm thick Pd film. An upper electrode 17 is made of a layered film having a 10-nm thick Ru film formed on a 10-nm thick Ta film.

In the MTJ element 10 according to Detailed Example 1-3, the coercive force and saturation magnetization are measured by using a vibrating sample magnetometer. The coercive force and saturation magnetization are 4.5 kOe and 800 emu/cc in the pinned layer 12 and 200 Oe and 550 emu/cc in the free layer 11. The pinned layer 12 and first highly spin-polarized layer 18 are exchange-coupled and behave as one magnetic layer. The free layer 11 and second highly spin-polarized layer 19 are exchange-coupled and behave as one magnetic layer. Hence, the above-described coercive forces and saturation magnetizations are values obtained when the layers are regarded as single magnetic materials. By contribution of the highly spin-polarized layers 18 and 19, the magnetoresistive ratio of the MTJ element 10 is 120%.

(d) Detailed Example 1-4

An MTJ element 10 of Detailed Example 1-4 has the same layered structure as that of Detailed Example 1-2 shown in FIG. 3. A highly spin-polarized layer is provided on each of the interface between a tunnel barrier layer TB and a free layer 11 and the interface between the tunnel barrier layer TB and a pinned layer 12. At least one of the free layer 11 and pinned layer 12 is made of an RE-TM amorphous alloy having a rare-earth metal (RE) and transition metal (TM).

The layered structure of Detailed Example 1-4 of the MTJ element 10 will be described below. A lower electrode 14 is made of a 10-nm thick Ta film. An underlayer 15 is made of a 5-nm thick Ru film. The pinned layer 12 is made of a 30-nm thick $(CO_{78}Pt_{12}Cr_{10})_{85}$—$(SiO_2)_{15}$ film with a (002) plane being oriented. A first highly spin-polarized layer 18 is made of a 2.0-nm thick $CO_{62}Fe_{22}B_{16}$ film. The tunnel barrier layer TB is made of a 1.0-nm thick MgO film. A second highly spin-polarized layer 19 is made of a 1.0-nm thick $CO_{60}Fe_2O_{20}$ film. The free layer 11 is made of a 10-nm thick $Tb_{27}(Fe_{71}CO_{29})_{73}$ film. A cap layer 16 is made of a 3-nm thick Pt film. An upper electrode 17 is made of a layered film having a 10-nm thick Ru film formed on a 10-nm thick Ta film.

In the MTJ element 10 according to Detailed Example 1-4, the coercive force and saturation magnetization are measured by using a vibrating sample magnetometer. The coercive force and saturation magnetization are 4.0 kOe and 500 emu/cc in the pinned layer 12 and 500 Oe and 300 emu/cc in the free layer 11. The pinned layer 12 and first highly spin-polarized layer 18 are exchange-coupled and behave as one magnetic layer. The free layer 11 and second highly spin-polarized layer 19 are exchange-coupled and behave as one magnetic layer. Hence, the above-described coercive forces and saturation magnetizations are values obtained when the layers are regarded as single magnetic materials. By contribution of the highly spin-polarized layers 18 and 19, the magnetoresistive ratio of the MTJ element 10 is 100%.

The pinned layer 12 may be made of a 50-nm thick $Tb_{22}(Fe_{71}CO_{29})_{78}$ film. In this case, since the RE-TM amorphous alloy such as $Tb_{22}(Fe_{71}CO_{29})_{78}$ is an amorphous alloy, the 5-nm thick Ru film used as the underlayer 15 is not always necessary. A Pt, Ru, or SiN film may be formed as a buffer layer to smoothly form the RE-TM alloy. In this case, the coercive force and saturation magnetization measured by the vibrating sample magnetometer were 8 kOe and 200 emu/cc.

The pinned layer 12 and first highly spin-polarized layer 18 are exchange-coupled and behave as one magnetic layer. Hence, the above-described coercive force and saturation magnetization are values obtained when the layers are regarded as a single magnetic material.

A synthetic ferrimagnetic structure (a structure in which a magnetic layer and a metal layer are alternately stacked) may be used as the pinned layer 12. Examples of the magnetic layer of the synthetic ferrimagnetic structure are Fe, Co, Ni, and alloys thereof. Examples of the metal layer of the synthetic ferrimagnetic structure are Ru, Ir, Rh, Re, and Os. Detailed examples of the synthetic ferrimagnetic structure are Co/Ru, Co/Ir, and Co/Rh. In this case, the pinned layer 12 is made of an artificial lattice [Ru/Co]15 formed by stacking 15 periods each including a 0.8-nm thick Ru film and a 0.3-nm thick Co film.

As the tunnel barrier layer TB, Al—O may be used. The stack order of the free layer 11 and pinned layer 12 may be reversed. To fix the pinned layer 12 in one direction, an antiferromagnetic layer may be provided adjacent. As the antiferromagnetic layer, an alloy of Mn and Fe, Ni, Pt, Pd, Ru, Os, or Ir, i.e., FeMn, NiMn, PtMn, PtPdMn, RuMn, OsMn, IrMn, or CrPtMn can be used.

(e) Detailed Example 1-5

An MTJ element of Detailed Example 1-5 has a synthetic antiferro (SAF) structure in which two magnetic layers included in a pinned layer 12 are antiferromagnetically exchange-coupled.

Figure 4:
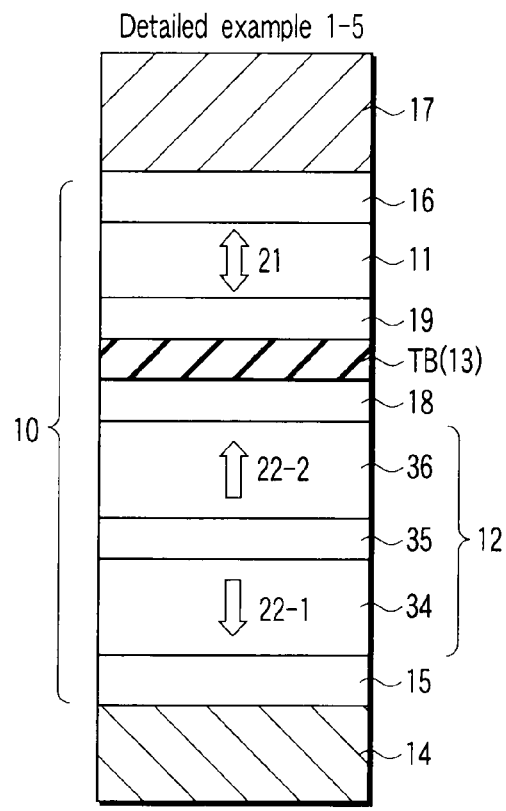
FIG. 4 is a schematic sectional view showing Detailed Example 1-5 of the MTJ element according to an embodiment of the present invention.

FIG. 4 is a schematic sectional view showing Detailed Example 1-5 of the MTJ element according to an embodiment of the present invention. Detailed Example 1-5 of an MTJ element 10 will be described below.

As shown in FIG. 4, in the MTJ element 10 of Detailed Example 1-5, the pinned layer 12 includes a first magnetic layer 34, a second magnetic layer 36, and a first nonmagnetic layer 35 provided between the first and second magnetic layers 34 and 36, and has an SAF structure in which the first and second magnetic layers 34 and 36 are antiferromagnetically exchange-coupled. In this case, since magnetizations 22-1 and 22-2 of the first and second magnetic layers 34 and 36 are antiparallel, leakage fields from the first and second magnetic layers 34 and 36 are canceled. As a result, the leakage field of the pinned layer 12 can be reduced. In addition, since the volume of the exchange-coupled magnetic layers 34 and 36 increases, the thermal agitation is suppressed.

The layered structure of Detailed Example 1-5 of the MTJ element 10 will be described below. A lower electrode 14 is made of a 10-nm thick Ta film. An underlayer 15 is made of a 5-nm thick Ru film. In the pinned layer 12, the first magnetic layer 34 is made of a 20-nm thick $(CO_{78}Pt_{12}Cr_{10})_{85}$—$(SiO_2)_{15}$ film with a (002) plane being oriented. The first nonmagnetic layer 35 is made of a 0.9-nm thick Ru film. The second magnetic layer 36 is made of a 15-nm thick $(CO_{78}Pt_{12}Cr_{10})_{85}$—$(SiO_2)_{15}$ film. A first highly spin-polarized layer 18 is made of a 1.0-nm thick $CO_{62}Fe_{22}B_{16}$ film. The tunnel barrier layer TB is made of a 1.0-nm thick MgO film. A free layer 11 is made of a layered film of [Co/Pt]5 formed by stacking five periods each including a 0.4-nm thick Co film and a 0.8-nm thick Pt film. The first Co layer of the layered film of [Co/Pt]5 formed on the MgO film functions as a second highly spin-polarized layer 19. A cap layer 16 is made of a 3-nm thick Pt film. An upper electrode 17 is made of a layered film having a 10-nm thick Ru film formed on a 10-nm thick Ta film.

The first nonmagnetic layer 35 to couple the magnetic layers 34 and 36 antiferromagnetically can be made of at least one element of Ru, Os, Re, and Rh or an alloy mainly containing them.

Antiferromagnetic coupling can also be implemented even when the first and second magnetic layers 34 and 36 are made of a ferrimagnetic material of an RE-TM alloy. In this case, the first nonmagnetic layer 35 need not always be used. An example will be described below with reference to FIGS. 5A and 5B.

In an RE-TM alloy, the magnetic moment of a rare-earth metal (RE) and that of a transition metal (TM) are antiferromagnetically coupled. When RE-TM alloys are stacked, REs are ferromagnetically coupled while TMs are ferromagnetically coupled, as is known. Since the magnetic moments of the RE and TM cancel each other, the magnetic moment of an RE-TM alloy can be adjusted by the composition.

Figure 5A:
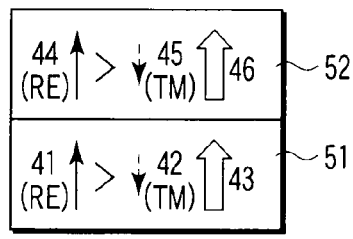
FIGS. 5A and 5B are schematic sectional views showing another example of Detailed Example 1-5 of the MTJ element according to an embodiment of the present invention.

For example, in an RE-TM alloy layer 51 in which a magnetic moment 41 of RE is larger than a magnetic moment 42 of TM, as shown in FIG. 5A, a remaining magnetic moment 43 is directed in the same direction as the magnetic moment 41 of RE. An RE-TM alloy layer 52 in which a magnetic moment 44 of RE is larger than a magnetic moment 45 of TM is formed on the RE-TM alloy layer 51. The magnetic moments 41 and 44 of REs are directed in the same direction while the magnetic moments 42 and 45 of TMs are directed in the same direction. The magnetic moments 43 and 46 of the two RE-TM alloy layers 51 and 52 are directed in the same direction so that they are arranged parallel.

Figure 5B:
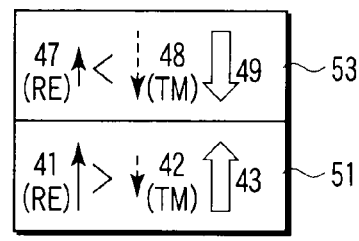

On the other hand, when an RE-TM alloy layer 53 in which a magnetic moment 47 of RE is smaller than a magnetic moment 48 of TM is formed on the RE-TM alloy layer 51, as shown in FIG. 5B, the magnetic moments 43 and 49 of the two RE-TM alloy layers 51 and 53 are arranged antiparallel.

For, e.g., a Tb—Co alloy, when the Tb content is 22 at %, a so-called compensation composition can be obtained so that the magnetic moment becomes zero because the magnitude of the magnetic moment of Tb equals that of the magnetic moment of Co. When a 10-nm thick $Tb_{25}CO_{75}$ film and a 10-nm thick $Tb_{20}CO_{80}$ film are stacked, their magnetic moments are antiparallel.

By using such a form, the MTJ element 10 in which two magnetic layers included in the pinned layer 12 are antiparallelly coupled can be formed. More specifically, the pinned layer 12 shown in FIG. 4 is formed by stacking the two, first and second magnetic layers 34 and 36 each made of an RE-TM alloy. For example, the first magnetic layer 34 is made of a 20-nm thick $Tb_{22}(Fe_{71}CO_{29})_{78}$ film, and the second magnetic layer 36 is made of a 15-nm thick $Tb_{26}(Fe_{71}CO_{29})_{74}$ film. In this case, the compensation composition is $Tb_{24}(Fe_{71}CO_{29})_{76}$.

When the first and second magnetic layers 34 and 36 are made of RE-TM alloys, antiferromagnetic coupling can be implemented by providing the first nonmagnetic layer 35 between the first and second magnetic layers 34 and 36. An example will be described below with reference to FIGS. 6A and 6B.

Figure 6A:
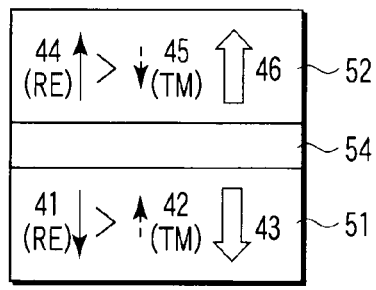
FIGS. 6A and 6B are schematic sectional views showing still another example of Detailed Example 1-5 of the MTJ element according to an embodiment of the present invention.

The magnetic moments 42 and 45 of the first and second magnetic layers 51 and 52 shown in FIG. 6A are supposed to exchange-couple through a nonmagnetic layer 54. Similarly, the magnetic moments 42 and 48 of the first and second magnetic layers 51 and 53 shown in FIG. 6B are supposed to exchange-couple through the nonmagnetic layer 54.

For example, when a metal or an alloy thereof is used as the nonmagnetic layer 54 to antiferromagnetically couple Co, as shown in FIG. 6A, the magnetic moment 41 of RE of the RE-TM alloy layer 51 is made larger than the magnetic moment 42 of TM, and the magnetic moment 44 of RE of the RE-TM alloy layer 52 is made larger than the magnetic moment 45 of TM. If the nonmagnetic layer 54 contributes to antiferromagnetic coupling, the magnetic moments of TM and RE are canceled each other by making the magnitude relationship between the magnetic moment 42 of TM and the magnetic moment 41 of RE equal to that between the magnetic moment 45 of TM and the magnetic moment 44 of RE. Hence, the magnetic moments 43 and 46 of the first and second magnetic layers 51 and 52 are arranged antiparallel. The nonmagnetic layer 54 to antiferromagnetically couple Co can be made of at least one element of Ru, Rh, Os, and Re or an alloy mainly containing them.

Figure 6B:
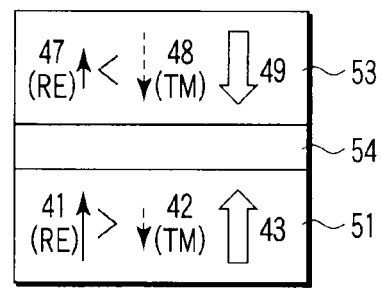

When a metal or an alloy thereof is used as the nonmagnetic layer 54 to ferromagnetically couple Co, as shown in FIG. 6B, the magnetic moment 41 of RE of the RE-TM alloy layer 51 is made larger than the magnetic moment 42 of TM, and the magnetic moment 47 of RE of the RE-TM alloy layer 53 is made smaller than the magnetic moment 48 of TM. If the nonmagnetic layer 54 contributes to ferromagnetic coupling, the magnetic moments of TM and RE are canceled each other by making the magnitude relationship between the magnetic moment 42 of TM and the magnetic moment 41 of RE reverse to that between the magnetic moment 48 of TM and the magnetic moment 47 of RE. Hence, the magnetic moments 43 and 49 of the first and second magnetic layers 51 and 53 are arranged antiparallel. The nonmagnetic layer 54 to ferromagnetically couple Co can be made of at least one element of Pt and Pd or an alloy mainly containing them.

By using such a form, the first magnetic layer 51, nonmagnetic layer 54, and the second magnetic layer 52 or 53 shown in FIGS. 6A and 6B are made to correspond to the first magnetic layer 34, nonmagnetic layer 35, and second magnetic layer 36 of the pinned layer 12 shown in FIG. 4.

To fix the pinned layer 12 in one direction, an antiferromagnetic layer may be provided adjacent. As the antiferromagnetic layer, an alloy of Mn and Fe, Ni, Pt, Pd, Ru, Os, or Ir, i.e., FeMn, NiMn, PtMn, PtPdMn, RuMn, OsMn, IrMn, or CrPtMn can be used.

An RE-TM alloy in which the magnetic moment of RE is larger than that of TM and a metal or alloy mainly containing a transition metal may be stacked.

(f) Detailed Example 1-6

In an MTJ element of Detailed Example 1-6, a free layer 11 is made of an artificial lattice with an SAF structure.

Figure 7:
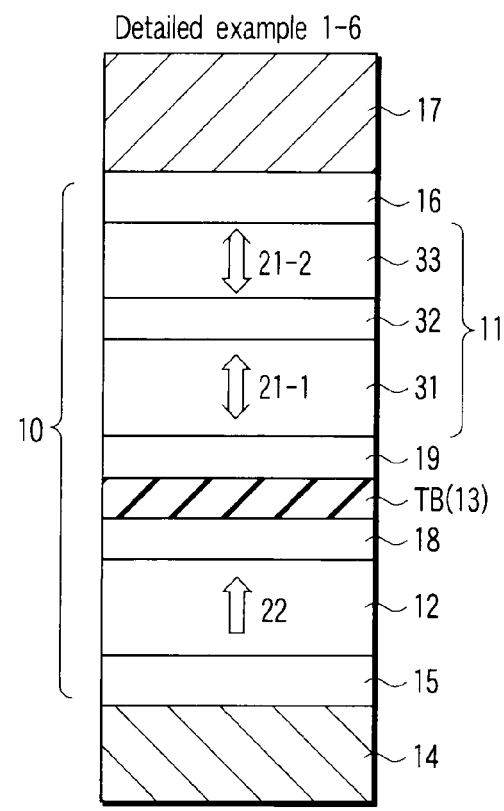
FIG. 7 is a schematic sectional view showing Detailed Example 1-6 of the MTJ element according to an embodiment of the present invention.

FIG. 7 is a schematic sectional view showing Detailed Example 1-6 of the MTJ element according to an embodiment of the present invention. Detailed Example 1-6 of an MTJ element 10 will be described below.

As shown in FIG. 7, in the MTJ element 10 of Detailed Example 1-6, the free layer 11 includes a first magnetic layer 31, first nonmagnetic layer 32, and second magnetic layer 33, and has an SAF structure in which the first and second magnetic layers 31 and 33 are antiferromagnetically exchange-coupled. In this case, since magnetizations 21-1 and 21-2 of the first and second magnetic layers 31 and 33 are antiparallel, leakage fields from the first and second magnetic layers 31 and 33 are canceled. As a result, the leakage field of the free layer 11 can be reduced. In addition, since the volume of the exchange-coupled magnetic layers 31 and 33 increases, the thermal agitation is suppressed.

The layered structure of Detailed Example 1-6 of the MTJ element 10 will be described below. A lower electrode 14 is made of a 10-nm thick Ta film. An underlayer 15 is made of a 3-nm thick Pt film formed on a 0.5-nm thick MgO film. The MgO/Pt layered film has a (001) plane oriented. A pinned layer 12 is made of a 20-nm thick $CO_{50}Pt_{50}$ film with a (001) plane being oriented. A first highly spin-polarized layer 18 is made of a 1.5-nm thick $CO_{62}Fe_{22}B_{16}$ film. A tunnel barrier layer TB is made of a 1.2-nm thick MgO film. A second highly spin-polarized layer 19 is made of a 0.8-nm thick $CO_{63}Fe_{17}B_{10}$ film. The first magnetic layer 31 of the free layer 11 is made of an artificial lattice [Pd/Co]4 formed by stacking four periods each including a 0.7-nm thick Pd film and a 0.3-nm thick Co film. The first nonmagnetic layer 32 of the free layer 11 is made of a 0.9-nm thick Ru film. The second magnetic layer 33 of the free layer 11 is made of an artificial lattice [Co/Pd]3 formed by stacking three periods each including a 0.3-nm thick Co film and a 0.7-nm thick Pd film. A cap layer 16 is made of a 3-nm thick Pd film. An upper electrode 17 is made of a layered film having a 10-nm thick Ru film formed on a 10-nm thick Ta film.

To fix the pinned layer 12 in one direction, an antiferromagnetic layer may be provided adjacent. As the antiferromagnetic layer, an alloy of Mn and Fe, Ni, Pt, Pd, Ru, Os, or Ir, i.e., FeMn, NiMn, PtMn, PtPdMn, RuMn, OsMn, IrMn, or CrPtMn can be used.

The first and second magnetic layers 31 and 33 need not be formed from an artificial lattice and may be made of an ordered alloy or disordered alloy. An RE-TM alloy in which the magnetic moment of RE is larger than that of TM and a metal or alloy mainly containing a transition metal may be stacked.

(g) Detailed Example 1-7

In an MTJ element of Detailed Example 1-7, both a free layer 11 and pinned layer 12 have an SAF structure.

Figure 8:
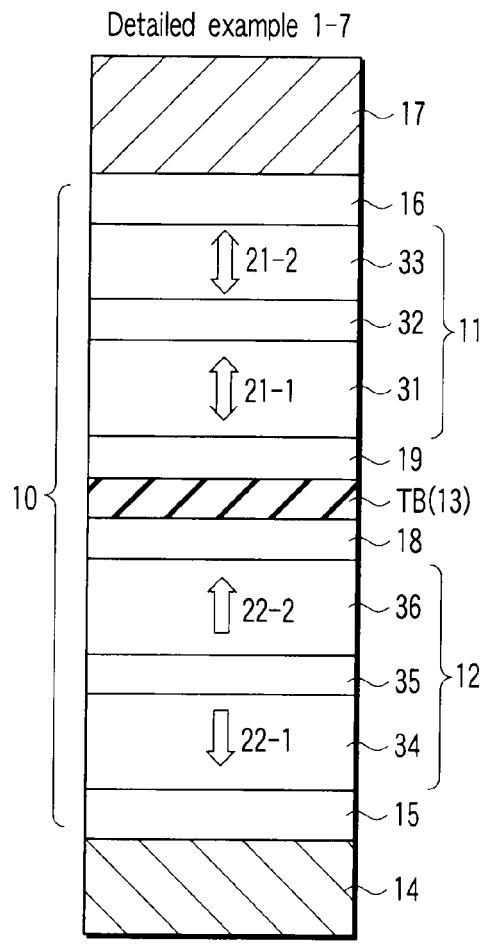
FIG. 8 is a schematic sectional view showing Detailed Example 1-7 of the MTJ element according to an embodiment of the present invention.

FIG. 8 is a schematic sectional view showing Detailed Example 1-7 of an MTJ element according to an embodiment of the present invention. Detailed Example 1-7 of an MTJ element 10 will be described below.

As shown in FIG. 8, in the MTJ element 10 of Detailed Example 1-7, the free layer 11 includes a first magnetic layer 31, first nonmagnetic layer 32, and second magnetic layer 33, and has an SAF structure in which the first and second magnetic layers 31 and 33 are antiferromagnetically exchange-coupled. In addition, the pinned layer 12 includes a first magnetic layer 34, first nonmagnetic layer 35, and second magnetic layer 36, and has an SAF structure in which the first and second magnetic layers 34 and 36 are antiferromagnetically exchange-coupled. In this case, since magnetizations 21-1 and 21-2 of the first and second magnetic layers 31 and 33 are antiparallel, leakage fields from the first and second magnetic layers 31 and 34 are canceled. As a result, the leakage field of the free layer 11 can be reduced. Similarly, since magnetizations 22-1 and 22-2 of the first and second magnetic layers 34 and 36 are antiparallel, leakage fields from the first and second magnetic layers 34 and 36 are canceled. As a result, the leakage field of the pinned layer 12 can be reduced. In addition, since the volume of the magnetic layers 31 and 33 and magnetic layers 34 and 36 which are exchange-coupled increases, the thermal agitation is suppressed.

The layered structure of Detailed Example 1-7 of the MTJ element 10 will be described below. A lower electrode 14 is made of a 10-nm thick Ta film. An underlayer 15 is made of a 5-nm thick Ru film. In the pinned layer 12, the first magnetic layer 34 is made of a 20-nm thick $(CO_{78}Pt_{12}Cr_{10})_{85}$—$(SiO_2)_{15}$ film with a (002) plane being oriented. The first nonmagnetic layer 35 is made of a 0.9-nm thick Ru film. The second magnetic layer 36 is made of a 15-nm thick $(CO_{78}Pt_{12}Cr_{10})_{85}$—$(SiO_2)_{15}$ film. A first highly spin-polarized layer 18 is made of a 1.0-nm thick $CO_{62}Fe_{22}B_{16}$ film. A tunnel barrier layer TB is made of a 1.2-nm thick MgO film. A second highly spin-polarized layer is made of a 0.8-nm thick $CO_{63}Fe_{17}B_{10}$ film. The first magnetic layer 31 of the free layer 11 is made of an artificial lattice [Pd/Co]4 formed by stacking four periods each including a 0.7-nm thick Pd film and a 0.3-nm thick Co film. The first nonmagnetic layer 32 of the free layer 11 is made of a 0.9-nm thick Ru film. The second magnetic layer 33 of the free layer 11 is made of an artificial lattice [Co/Pd]3 formed by stacking three periods each including a 0.3-nm thick Co film and a 0.7-nm thick Pd film. A cap layer 16 is made of a 3-nm thick Pd film. An upper electrode 17 is made of a layered film having a 10-nm thick Ru film formed on a 10-nm thick Ta film.

To fix the pinned layer 12 in one direction, an antiferromagnetic layer may be provided adjacent. As the antiferromagnetic layer, an alloy of Mn and Fe, Ni, Pt, Pd, Ru, Os, or Ir, i.e., FeMn, NiMn, PtMn, PtPdMn, RuMn, OsMn, IrMn, or CrPtMn can be used.

The antiparallel coupling structure may be obtained by using a layered film of an RE-TM alloy in which the magnitude relationship between the magnetic moment of RE and the magnetic moment of RE is reversed, stacking an RE-TM alloy in which the magnetic moment of RE is larger than that of TM and a metal or alloy mainly containing a transition metal, or forming a so-called SAF structure with a nonmagnetic, e.g., Ru layer sandwiched.

[1-2] Dual Pin Structure 1

Figure 9A:
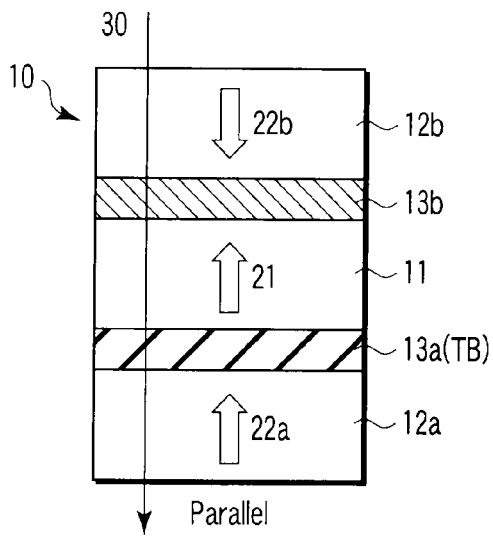
FIGS. 9A and 9B are schematic views showing an MTJ element with a dual pin structure 1 according to an embodiment of the present invention.
Figure 9B:
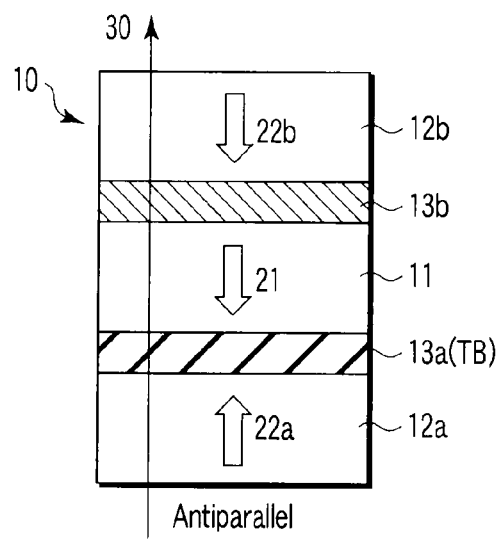

FIGS. 9A and 9B are schematic sectional views showing an MTJ element with a dual pin structure 1 according to an embodiment of the present invention. The MTJ element with a dual pin structure 1 according to an embodiment of the present invention will be described below.

As shown in FIGS. 9A and 9B, an MTJ element 10 has a layered structure including a free layer 11 formed from a magnetic layer, first and second pinned layers 12a and 12b each formed from a magnetic layer, a first nonmagnetic layer 13a sandwiched between the free layer 11 and the first pinned layer 12a, and a second nonmagnetic layer 13b sandwiched between the free layer 11 and the second pinned layer 12b. The MTJ element 10 is of so-called perpendicular magnetization type in which a magnetization direction 21 of the free layer 11 and magnetization directions 22a and 22b of the pinned layers 12a and 12b are perpendicular to the film surface. The first and second pinned layers 12a and 12b have an antiparallel magnetization arrangement with the magnetization directions 22a and 22b being directed in different directions.

When the first and second nonmagnetic layers 13a and 13b are made of an insulator, the MTJ element 10 has a TMR effect. When the first and second nonmagnetic layers 13a and 13b are made of a metal, the MTJ element 10 has a GMR effect. The first and second nonmagnetic layers 13a and 13b made of an insulator use, e.g., MgO (magnesium oxide) or AlO (aluminum oxide; e.g., $Al_2O_3$). The first and second nonmagnetic layers 13a and 13b made of a metal use, e.g., Cu, Pt or Au.

(Operation)

In the MTJ element 10 with the dual pin structure 1, the magnetic layers (free layer 11 and pinned layer 12a) sandwiching the first nonmagnetic layer 13a or the magnetic layers (free layer 11 and pinned layer 12b) sandwiching the second nonmagnetic layer 13b have a parallel or antiparallel magnetization arrangement. However, in the entire MTJ element 10, the parallel arrangement and antiparallel arrangement simultaneously exist in FIGS. 9A and 9B so the entire magnetoresistance does not change. Hence, when the pinned layers 12a and 12b with an antiparallel magnetization arrangement are provided on both sides of the free layer 11, a difference must be ensured between changes in magnetoresistance through the first and second nonmagnetic layers 13a and 13b.

For example, when the first nonmagnetic layer 13a is a tunnel barrier layer TB, and the second nonmagnetic layer 13b is a metal layer, the change in magnetoresistance generated in the tunnel barrier layer TB is larger than that generated in the metal layer. The magnetization arrangement through the first nonmagnetic layer 13a corresponds to "0" or "1" information. Hence, a parallel arrangement is obtained in FIG. 9A, and an antiparallel arrangement is obtained in FIG. 9B. The second nonmagnetic layer 13b may be the tunnel barrier layer TB, and the first nonmagnetic layer 13a may be a metal layer.

As described above, when the first nonmagnetic layer 13a is the tunnel barrier layer TB, the magnetizations of the two magnetic layers (free layer 11 and pinned layer 12a) are arranged parallel (FIG. 9A) or antiparallel (FIG. 9B). The resistance value which changes depending on the magnetization arrangement state corresponds to "0" or "1" information. A spin polarized current 30 is supplied to the MTJ element 10 to change the magnetization direction 21 of the free layer 11 and write information. Spin-polarized electrons flow in a reverse direction to the spin polarized current 30.

More specifically, when the spin polarized current 30 flows from the second pinned layer 12b to the first pinned layer 12a, as shown in FIG. 9A, the spin-polarized electrons flows from the first pinned layer 12a to the second pinned layer 12b. In this case, upward spin is mainly injected from the first pinned layer 12a. For this reason, a torque to make the spin of the free layer 11 parallel works. The second pinned layer 12b readily transmits downward spin in the process of flowing the spin-polarized electrons from the free layer 11 to the second pinned layer 12b. Hence, the reflected upward spin-polarized electrons are injected to the free layer 11 so that the magnetization direction 21 of the free layer 11 becomes parallel to the magnetization direction 22a of the first pinned layer 12a. On the other hand, when the current flows from the second pinned layer 12b to the first pinned layer 12a, as shown in FIG. 9B, the magnetization direction 21 of the free layer 11 becomes parallel to the magnetization direction 22b of the second pinned layer 12b on the basis of the same principle as described above.

(Magnetic Materials)

As the magnetic materials of the free layer 11 and pinned layers 12a and 12b, the same materials as in the above-described single pin structure can be used.

(Effects)

According to the MTJ element 10 with the dual pin structure 1 of an embodiment of the present invention, the same effect as in the single pin structure can be obtained. In addition, since the effect of reflection of spin-polarized electrons can be used more effectively by providing the pinned layers 12a and 12b with the dual pin structure on both sides of the free layer 11, the reversal current can further be reduced as compared to the single pin structure.

Detailed examples of the MTJ element 10 with the dual pin structure 1 will be described below.

(a) Detailed Example 2-1

In an MTJ element of Detailed Example 2-1, one pinned layer 12a of pinned layers 12a and 12b provided on both sides of a free layer 11 has an SAF structure.

Figure 10:
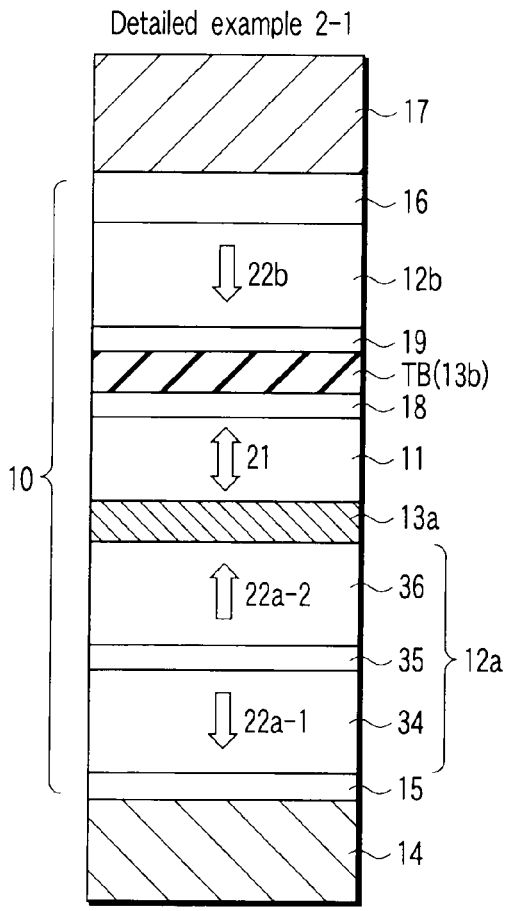
FIG. 10 is a schematic sectional view showing Detailed Example 2-1 of the MTJ element according to an embodiment of the present invention.

FIG. 10 is a schematic sectional view showing Detailed Example 2-1 of the MTJ element according to an embodiment of the present invention. Detailed Example 2-1 of an MTJ element 10 will be described below.

As shown in FIG. 10, the MTJ element 10 has a structure in which an underlayer 15, first pinned layer 12a, first nonmagnetic layer 13a, free layer 11, first highly spin-polarized layer 18, second nonmagnetic layer 13b, second highly spin-polarized layer 19, second pinned layer 12b, and cap layer 16 are stacked in an order named. The first pinned layer 12a has an SAF structure including a first magnetic layer 34, nonmagnetic layer 35, and second magnetic layer 36. A lower electrode 14 is provided on the lower surface of the underlayer 15. An upper electrode 17 is provided on the upper surface of the cap layer 16. In this case, since magnetizations 22a-1 and 22a-2 of the first and second magnetic layers 34 and 36 are antiparallel, leakage fields from the first and second magnetic layers 34 and 36 are canceled. As a result, the leakage field of the pinned layer 12a can be reduced. In addition, since the volume of the exchange-coupled magnetic layers 34 and 36 increases, the thermal agitation is suppressed.

The layered structure of Detailed Example 2-1 of the MTJ element 10 will be described below. The lower electrode 14 is made of a 10-nm thick Ta film. The underlayer 15 is made of a 5-nm thick Ru film. In the pinned layer 12a, the first magnetic layer 34 is made of a 20-nm thick $(CO_{78}Pt_{12}Cr_{10})_{85}$—$(SiO_2)_{15}$ film with a (002) plane being oriented. The nonmagnetic layer 35 is made of a 0.9-nm thick Ru film. The second magnetic layer 36 is made of a 15-nm thick $(CO_{78}Pt_{12}Cr_{10})_{85}$—$(SiO_2)_{15}$ film. The first nonmagnetic layer 13a is made of a 5-nm thick Cu film. The free layer 11 is made of an artificial lattice [Co/Pt]4 formed by stacking four periods each including a 0.3-nm thick Co film and a 0.7-nm thick Pt film. The first highly spin-polarized layer 18 is made of a 0.5-nm thick $CO_{62}Fe_{22}B_{16}$ film. The tunnel barrier layer TB is made of a 1.5-nm thick MgO film. The MgO film has a (001) plane oriented. The second highly spin-polarized layer 19 is made of a 1-nm thick Fe film. The Fe film has a (001) plane oriented. The pinned layer 12b is made of a 15-nm thick $Fe_{50}Pt_{50}$ film with a (001) plane being oriented. The cap layer 16 is made of a 3-nm thick Pt film. The upper electrode 17 is made of a layered film having a 10-nm thick Ru film formed on a 10-nm thick Ta film. The MR ratio generated through the tunnel barrier layer TB is higher than that generated through the nonmagnetic layer 13a.

In this structure, the change in magnetoresistance through MgO as the tunnel barrier layer TB is larger than that through Cu as the first nonmagnetic layer 13a. Information is stored in accordance with the magnetization arrangement of the magnetic layer that integrates the free layer 11 and first highly spin-polarized layer 18 and the magnetic layer that integrates the second highly spin-polarized layer 19 and second pinned layer 12b. Since the pinned layer 12a has the SAF structure with a thickness difference between the magnetic layers, the balance magnetic moment of the pinned layer 12a and the magnetic moment of the pinned layer 12b can be set in reverse directions. Hence, the leakage fields from the pinned layers 12a and 12b to the free layer 11 can cancel each other.

The pinned layer 12a can also be formed by using an RE-TM alloy. When an RE-TM alloy in which the magnetic moment of RE is larger than that of TM is used, and, e.g., a Co or CoFe alloy mainly containing TM is stacked, as described in Detailed Example 1-5, the magnetic moment of Co or CoFe on the interface of the second nonmagnetic layer 13a can be set parallel to the magnetic moment of TM of the RE-TM alloy. Hence, the magnetic moment of Co or CoFe can be set antiparallel to the magnetic moment of the RE-TM alloy (magnetic moment of RE).

(b) Detailed Example 2-2

As shown in FIG. 9, in an MTJ element of Detailed Example 2-2, both pinned layers 12a and 12b provided on both sides of a free layer 11 have a monolayer structure. That is, in Detailed Example 2-2, the pinned layer 12a shown in FIG. 10 has a monolayer structure. Detailed Example 2-2 of an MTJ element 10 will be described below with reference to FIG. 10.

As shown in FIG. 10, the MTJ element 10 has a structure in which an underlayer 15, first pinned layer 12a, first nonmagnetic layer 13a, free layer 11, first highly spin-polarized layer 18, second nonmagnetic layer 13b, second highly spin-polarized layer 19, second pinned layer 12b, and cap layer 16 are stacked in an order named. A lower electrode 14 is provided on the lower surface of the underlayer 15. An upper electrode 17 is provided on the upper surface of the cap layer 16.

The layered structure of Detailed Example 2-2 of the MTJ element 10 will be described below. The lower electrode 14 is made of a 10-nm thick Ta film. The underlayer 15 is made of a layered film obtained by forming a 0.5-nm thick $CO_{40}Fe_4O_{20}$ film, a 0.5-nm thick MgO film, and a 2-nm thick Pt film in an order named. The pinned layer 12a is made of a 10-nm thick $Fe_{50}Pt_{50}$ film with a (001) plane being oriented. The first nonmagnetic layer 13a is made of a 5-nm thick Au film with a (001) plane being oriented. The free layer 11 is made of a 2-nm thick $Fe_{38}Cu_{12}Pt_{50}$ film with a (001) plane being oriented. The first highly spin-polarized layer 18 is made of a 0.5-nm thick Fe film. The tunnel barrier layer TB is made of a 1.2-nm thick MgO film. The MgO film has a (001) plane oriented. The second highly spin-polarized layer 19 is made of a 1-nm thick Fe film. The Fe film has a (001) plane oriented. The pinned layer 12b is made of a 5-nm thick $Fe_{50}Pt_{50}$ film with a (001) plane being oriented. The cap layer 16 is made of a 3-nm thick Pt film. The upper electrode 17 is made of a layered film having a 10-nm thick Ru film formed on a 10-nm thick Ta film.

The MR ratio generated through the tunnel barrier layer TB is higher than that generated through the nonmagnetic layer 13a.

The coercive force of the pinned layer 12a is larger than that of the pinned layer 12b. The magnetization arrangement of the pinned layer 12a and that of the pinned layer 12b can be set antiparallel by using the difference in coercive force. That is, magnetization is done twice. By magnetic field application of the first time, the magnetization of the pinned layer 12a, that of the free layer 11 and first highly spin-polarized layer 18 which behave as an integrated free layer, and that of the second highly spin-polarized layer 19 and pinned layer 12b which behave as an integrated pinned layer are arranged in the same direction. Magnetic field application of the second time is done in a reverse direction to the first time. The applied magnetic field of the second time is larger than the coercive force of the second highly spin-polarized layer 19 and pinned layer 12b which behave as an integrated pinned layer and smaller than that of the pinned layer 12a. Hence, the magnetization of the free layer 11 and first highly spin-polarized layer 18 which behave as an integrated free layer and that of the second highly spin-polarized layer 19 and pinned layer 12b which behave as an integrated pinned layer are arranged in a reverse direction to the magnetization direction of the pinned layer 12a. Hence, the magnetization arrangement shown in FIG. 9 can be realized.

In this structure, the change in magnetoresistance through MgO serving as the tunnel barrier layer TB is larger than that through Au serving as the first nonmagnetic layer 13a. Information is stored by the magnetization arrangement of the magnetic layer including the free layer 11 and first highly spin-polarized layer 18 and the magnetic layer including the second highly spin-polarized layer 19 and pinned layer 12b. The magnetoresistance through a metal film such as an Au film is low. Even when a highly spin-polarized layer is provided, the change in magnetoresistance is smaller than in the tunnel barrier layer. Hence, a highly spin-polarized layer can be provided.

In the above-described MTJ element 10, the pinned layer 12a is made of a 30-nm thick $Tb_{22}(Fe_{71}CO_{29})_{78}$ layer, the pinned layer 12b is made of a 30-nm thick $Tb_{26}(Fe_{71}CO_{29})_{74}$ layer, and the free layer 11 is made of a 5-nm thick $Tb_{22}(Fe_{71}CO_{29})_{78}$ layer. At this time, $Tb_{24}(Fe_{71}CO_{29})_{76}$ has a compensation composition. In this case, in the pinned layer 12a, the magnetic moment of TM is larger than that of RE. In the pinned layer 12b, the magnetic moment of RE is larger than that of TM. Hence, the same magnetization arrangement as that of the pinned layers 12a and 12b in FIG. 9 can be realized by only one magnetization in one direction. More specifically, the magnetic moment of TM of the pinned layer 12b is directed in a reverse direction to the magnetic moment of RE. The magnetization of the entire pinned layer 12b is directed in a reverse direction to the magnetization direction (direction of the magnetic moment of TM). In addition, Fe serving as the second highly spin-polarized layer 19 is exchange-coupled to the magnetic moment of TM and therefore directed in a reverse direction to the magnetization direction.

The material of each magnetic layer can appropriately be selected from ordered alloys, disordered alloys, artificial lattices, and RE-TM alloys, as described in Detailed Examples 1-1 to 1-7.

The pinned layer 12b may have an SAF structure. Alternatively, the pinned layer 12a may have a monolayer structure.

In Detailed Example 2-2, the highly spin-polarized layers 18 and 19 are inserted between the tunnel barrier layer TB and the free layer 11 and between the tunnel barrier layer TB and the pinned layer 12b, respectively. The highly spin-polarized layer is provided neither between the nonmagnetic layer 13a and the free layer 11 nor between the nonmagnetic layer 13a and the pinned layer 12a. However, highly spin-polarized layers may be provided between the nonmagnetic layer 13a and the free layer 11 and between the nonmagnetic layer 13a and the pinned layer 12a. Even in this case, the MR ratio generated through the tunnel barrier layer TB must be higher than that generated through the nonmagnetic layer 13a. The nonmagnetic layers 13a and 13b may be made of an insulator or tunnel barrier exhibiting a tunneling magnetoresistive effect. In this case, when a highly spin-polarized layer is provided on the interface of only one tunnel barrier, the difference between the MR ratios can be ensured.

To fix the pinned layers 12a and 12b in one direction, an antiferromagnetic layer may be provided adjacent. As the antiferromagnetic layer, an alloy of Mn and Fe, Ni, Pt, Pd, Ru, Os, or Ir, i.e., FeMn, NiMn, PtMn, PtPdMn, RuMn, OsMn, IrMn, or CrPtMn can be used.

[1-3] Dual Pin Structure 2

Figure 11A:
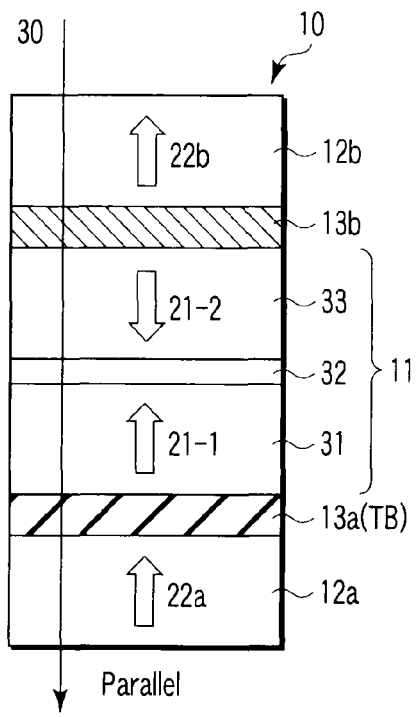
FIGS. 11A and 11B are schematic views showing an MTJ element with a dual pin structure 2 according to an embodiment of the present invention.
Figure 11B:
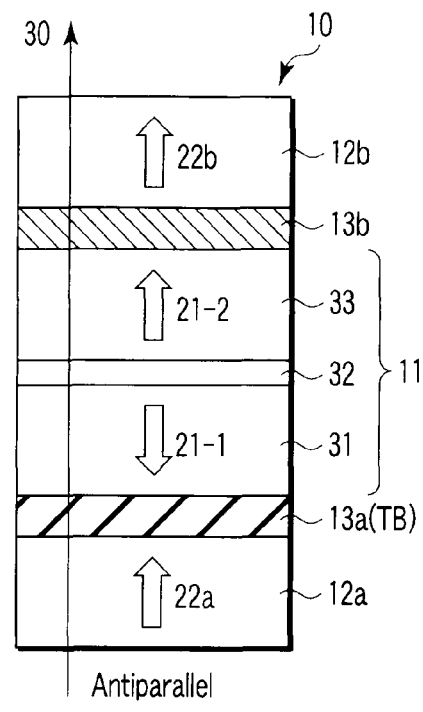

FIGS. 11A and 11B are schematic sectional views showing an MTJ element with a dual pin structure 2 according to an embodiment of the present invention. The MTJ element with a dual pin structure 2 according to an embodiment of the present invention will be described below.

As shown in FIGS. 11A and 11B, an MTJ element 10 has a layered structure including a free layer 11 formed from a magnetic layer, first and second pinned layers 12a and 12b each formed from a magnetic layer, first nonmagnetic layer 13a sandwiched between the free layer 11 and the first pinned layer 12a, and a second nonmagnetic layer 13b sandwiched between the free layer 11 and the second pinned layer 12b. The free layer 11 has an SAF structure including a first magnetic layer 31, nonmagnetic layer 32, and second magnetic layer 33. The MTJ element 10 is of so-called perpendicular magnetization type in which magnetizations 21-1 and 21-2 of the free layer 11 and magnetization directions 22a and 22b of the pinned layers 12a and 12b are perpendicular to the film surface.

This structure is different from Detailed Example 2-1 in that the magnetization directions 22a and 22b of the first and second pinned layers 12a and 12b are arranged parallel. According to this, the free layer 11 preferably has an SAF structure. However, as described in Detailed Example 1-5, an RE-TM alloy layer 51 in which a magnetic moment 41 of RE is larger than a magnetic moment 42 of TM and an RE-TM alloy layer 53 in which a magnetic moment 47 of RE is smaller than a magnetic moment 48 of TM may be stacked to make the magnetic moments of the two RE-TM alloy layers antiparallel.

When the first and second nonmagnetic layers 13a and 13b are made of an insulator, the MTJ element 10 has a TMR effect. When the first and second nonmagnetic layers 13a and 13b are made of a metal, the MTJ element 10 has a GMR effect. The first and second nonmagnetic layers 13a and 13b made of an insulator use, e.g., MgO (magnesium oxide) or AlO (aluminum oxide; e.g., $Al_2O_3$). The first and second nonmagnetic layers 13a and 13b made of a metal use, e.g., Cu, Pt or Au.

(Operation)

In the MTJ element 10 with the dual pin structure 2, the magnetic layers (the magnetic layer 31 of the free layer 11 and the pinned layer 12a) sandwiching the first nonmagnetic layer 13a or the magnetic layers (the magnetic layer 33 of the free layer 11 and the pinned layer 12b) sandwiching the second nonmagnetic layer 13b have a parallel or antiparallel magnetization arrangement. However, in the entire MTJ element 10, the parallel arrangement and antiparallel arrangement simultaneously exist in FIGS. 11A and 11B so the entire magnetoresistance does not change. Hence, when the pinned layers 12a and 12b with a parallel magnetization arrangement are provided on both sides of the free layer 11, a difference must be ensured between changes in magnetoresistance through the first and second nonmagnetic layers 13a and 13b.

For example, when the first nonmagnetic layer 13a is a tunnel barrier layer TB, and the second nonmagnetic layer 13b is a metal layer, the change in magnetoresistance generated in the tunnel barrier layer TB is larger than that in the metal layer. The magnetization arrangement through the first nonmagnetic layer 13a corresponds to "0" or "1" information. Hence, a parallel arrangement is obtained in FIG. 11A, and an antiparallel arrangement is obtained in FIG. 11B. The second nonmagnetic layer 13b may be the tunnel barrier layer TB, and the first nonmagnetic layer 13a may be a metal layer. The nonmagnetic layers 13a and 13b may be made of an insulator or tunnel barrier exhibiting a tunneling magnetoresistive effect. In this case, when a highly spin-polarized layer is provided on the interface of only one tunnel barrier, the difference between the MR ratios can be ensured.

As described above, when the first nonmagnetic layer 13a is the tunnel barrier layer TB, the magnetizations of the two magnetic layers (the magnetic layer 31 of the free layer 11 and pinned layer 12a) are arranged parallel (FIG. 11) or antiparallel (FIG. 11B). The resistance value which changes depending on the magnetization arrangement state corresponds to "0" or "1" information. A spin polarized current 30 is supplied to the MTJ element 10 to change the magnetization direction 21 of the free layer 11 and write information. Spin-polarized electrons flow in a reverse direction to the spin polarized current 30.

More specifically, when the spin polarized current 30 flows from the second pinned layer 12b to the first pinned layer 12a, as shown in FIG. 11A, the spin-polarized electrons flows from the first pinned layer 12a to the second pinned layer 12b. In this case, upward spin is mainly injected from the first pinned layer 12a. For this reason, a torque to make the spin of the first magnetic layer 31 of the free layer 11 parallel words. The second pinned layer 12b readily transmits upward spin in the process of flowing the electrons from the second magnetic layer 33 of the free layer 11 to the second pinned layer 12b. Hence, the reflected downward spin-polarized electrons are injected to the second magnetic layer 33 of the free layer 11 so that the magnetization direction 21-1 of the first magnetic layer 31 of the free layer 11 becomes parallel to the magnetization direction 22a of the pinned layer 12a, and the magnetization direction 21-2 of the second magnetic layer 33 becomes antiparallel to the magnetization direction 22b of the pinned layer 12b. On the other hand, when the current flows from the second pinned layer 12b to the first pinned layer 12a, as shown in FIG. 11B, the magnetization direction 21-1 of the first magnetic layer 31 of the free layer 11 becomes antiparallel to the magnetization direction 22a of the pinned layer 12a, and the magnetization direction 21-2 of the second magnetic layer 33 becomes parallel to the magnetization direction 22b of the pinned layer 12b.

(Magnetic Materials)

As the magnetic materials of the magnetic layers 31 and 33 of the free layer 11 and the pinned layers 12a and 12b, the same materials as in the above-described single pin structure can be used.

(Effects)

According to the MTJ element 10 with the dual pin structure 2 of an embodiment of the present invention, the same effect as in the single pin structure can be obtained. In addition, since the effect of reflection of spin-polarized electrons can be used more effectively by providing the pinned layers 12a and 12b with the dual pin structure on both sides of the free layer 11, the reversal current can further be reduced as compared to the single pin structure.

Detailed examples of the MTJ element 10 with the dual pin structure 2 will be described below.

(a) Detailed Example 3

In an MTJ element of Detailed Example 3, the free layer 11 has an SAF structure, and the magnetization directions of first and second pinned layers 12a and 12b are parallel.

Figure 12:
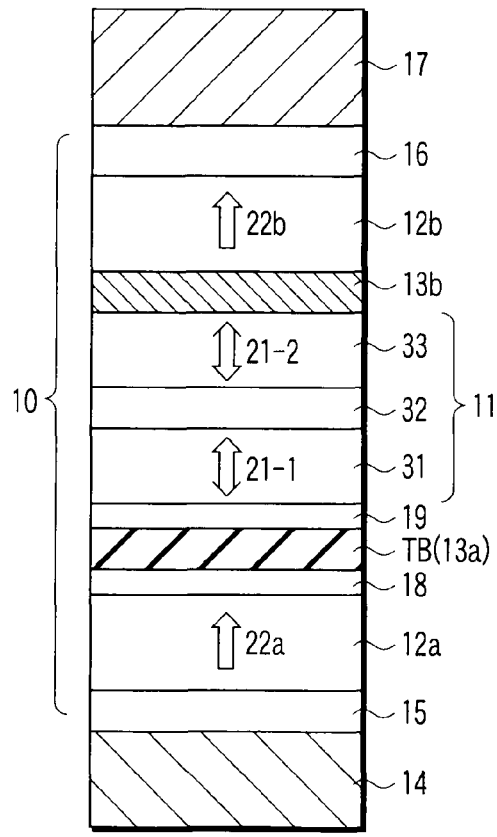
FIG. 12 is a schematic sectional view showing Detailed Example 3 of the MTJ element according to an embodiment of the present invention.

FIG. 12 is a schematic sectional view showing Detailed Example 3 of the MTJ element according to an embodiment of the present invention. Detailed Example 3 of an MTJ element 10 will be described below.

As shown in FIG. 12, the MTJ element 10 has a structure in which an underlayer 15, first pinned layer 12a, first highly spin-polarized layer 18, tunnel barrier layer TB, second highly spin-polarized layer 19, free layer 11, second nonmagnetic layer 13b, second pinned layer 12b, and cap layer 16 are stacked in an order named. The free layer 11 has an SAF structure including a first magnetic layer 31, nonmagnetic layer 32, and second magnetic layer 33. A lower electrode 14 is provided on the lower surface of the underlayer 15. An upper electrode 17 is provided on the upper surface of the cap layer 16. In this case, since magnetizations 21-1 and 21-2 of the first and second magnetic layers 31 and 33 are antiparallel, leakage fields from the first and second magnetic layers 31 and 33 are canceled. As a result, the leakage field of the free layer 11 can be reduced. In addition, since the volume of the exchange-coupled magnetic layers 31 and 33 increases, the thermal agitation is suppressed.

The layered structure of Detailed Example 3 of the MTJ element 10 will be described below. The lower electrode 14 is made of a 10-nm thick Ta film. The underlayer 15 is made of a 3-nm thick Pt film formed on a 0.5-nm thick MgO film. The MgO/Pt layered film has a (001) plane oriented. The first pinned layer 12a is made of a 20-nm thick $Fe_{50}Pt_{50}$ film with a (001) plane being oriented. The first highly spin-polarized layer 18 is made of a 1.5-nm thick $CO_{62}Fe_{22}B_{16}$ film. The tunnel barrier layer TB is made of a 1.5-nm thick MgO film. The second highly spin-polarized layer 19 is made of a 0.5-nm thick $CO_{63}Fe_{17}B_{10}$ film. The first magnetic layer 31 of the free layer 11 is made of an artificial lattice [Pd/Co]4 formed by stacking four periods each including a 0.7-nm thick Pd film and a 0.3-nm thick Co film. The nonmagnetic layer 32 of the free layer 11 is made of a 0.9-nm thick Ru film. The second magnetic layer 33 of the free layer 11 is made of an artificial lattice [Co/Pd]2/Co formed by stacking two periods each including a 0.3-nm thick Co film and a 0.7-nm thick Pd film. The second nonmagnetic layer 13b is made of a 0.8-nm thick MgO film. The second pinned layer 12b is made of layered film inducing a 1.5-nm thick $CO_{90}Fe_{10}$ film and a 30-nm thick $Tb_{20}(Fe_{80}CO_{20})_{80}$ film. In $Tb_{20}(Fe_{80}CO_{20})_{80}$, the magnetic moment of RE is smaller than that of TM so that the magnetization directions 22a and 22b of the first and second pinned layers 12a and 12b become parallel. The cap layer 16 is made of a 3-nm thick Pt film. The upper electrode 17 is made of a layered film having a 10-nm thick Ru film formed on a 10-nm thick Ta film. The MR ratio generated through the tunnel barrier layer TB having highly spin-polarized layers inserted to both interfaces is higher than that generated through the nonmagnetic layer 13b without any highly spin-polarized layer inserted.

The material of each magnetic layer can appropriately be selected from ordered alloys, disordered alloys, artificial lattices, and RE-TM alloys, as described in Detailed Examples 1-1 to 1-7.

In Detailed Example 3, the highly spin-polarized layers 18 and 19 are inserted between the tunnel barrier layer TB and the magnetic layer 31 of the free layer 11 and between the tunnel barrier layer TB and the pinned layer 12a, respectively. The highly spin-polarized layer is provided neither between the nonmagnetic layer 13b and the magnetic layer 33 of the free layer 11 nor between the nonmagnetic layer 13b and the pinned layer 12b. However, highly spin-polarized layers may be provided between the nonmagnetic layer 13b and the magnetic layer 33 of the free layer 11 and between the nonmagnetic layer 13b and the pinned layer 12b. Even in this case, the MR ratio generated through the tunnel barrier layer TB must be higher than that generated through the nonmagnetic layer 13b.

To fix the pinned layers 12a and 12b in one direction, an antiferromagnetic layer may be provided adjacent. As the antiferromagnetic layer, an alloy of Mn and Fe, Ni, Pt, Pd, Ru, Os, or Ir, i.e., FeMn, NiMn, PtMn, PtPdMn, RuMn, OsMn, IrMn, or CrPtMn can be used.

[1-4] Examination of, e.g., Saturation Magnetization of Free layer

The above-described various detailed examples are examples of the arrangement of a perpendicular magnetic film to implement current induced magnetization reversal. For example, to obtain a large-capacity memory having a capacity of 256 Mbits or more, write current reduction is essential. The write current is restricted by a current that can be supplied by the write select transistor. Magnetization reversal must occur at a spin polarized current equal to or smaller than the write current. If the gate length of the select transistor decreases along with the progress of microfabrication, the current value of the write current also decreases. For this reason, a write current density Jw must be suppressed to $5 \times 10^6$ $A/cm^2$ or less, and more preferably, $2 \times 10^6$ $A/cm^2$ or less.

According to nonpatent references 3 and 4, the reversal current can roughly be estimated by equation (1). Equation (1) represents a reversal current when the magnetization state reverses from parallel (P) to antiparallel (AP). The reversal current is larger when the magnetization state changes from parallel (P) to antiparallel (AP) than when the magnetization state changes from antiparallel (AP) to parallel (P). The former case will be examined.

$$I_{c0}^{P \to AP} = \frac{g' \cdot e \cdot M_s \cdot V \cdot \alpha_{damp}}{\hbar \cdot g(0)} \cdot (H_{ext} + H_{ani} + 2\pi M_s) \quad (1)$$

where e is the elementary charge, Ms is the saturation magnetization of the reversed magnetic layer (free layer 11), V is the volume, αdamp is the Gilbert's damping constant, h is a constant obtained by dividing the Planck's constant by 2π, g' is a g-factor, g(θ) is the function of polarization or the spin transfer efficiency when two magnetic materials make an angle θ. When the magnetization state changes from parallel (P) to antiparallel (AP), θ=0. When the magnetization state changes from antiparallel (AP) to parallel (P), θ=π. Hext is the external field, and Hani is the anisotropy field. The anisotropy field Hani is generally generated by magnetic anisotropy caused by shape magnetic anisotropy and materials. The coefficient g' (g-factor) is one of coefficients that connects a magnetic moment to angular momentum. For orbital angular momentum, g'=1. For spin angular momentum, g'=2. According to Soshin Chikazumi, "Physics of Ferromagnetism" Vol. 1, pp. 73-79, the g-factor is almost 2 for a 3d transition metal.

Assuming that the external field Hext is zero, and the shape anisotropy (∝Ms×t/w; t is the thickness, and w is the element width) is sufficiently smaller than a magnetic anisotropy field (Hk) caused by the materials, equation (1) can be rewritten to $$I_{c0}^{P \to AP} = \frac{g' \cdot e \cdot \alpha_{damp}}{\hbar \cdot g(0)} \cdot V \cdot (M_s H_k + 2\pi M_s^2) \quad (2)$$

In equation (2), the first term in the parentheses represents a magnetic anisotropy energy density Ku, and the second term in the parentheses represents the demagnetizing field energy.

Since the volume V is given by V=S×t (S is the cell area), the reversal current density is given by $$J_{c0}^{P \to AP} = \frac{g' \cdot e \cdot \alpha_{damp}}{\hbar \cdot g(0)} \cdot t \cdot (M_s H_k + 2\pi M_s^2) \quad (3)$$

Actually, a perpendicular magnetic film is suitable for microfabrication when the magnetic anisotropy energy density Ku, e.g., magnetocrystalline anisotropy energy density caused by the materials is high, no shape magnetic anisotropy energy density is used, and the aspect ratio of the element shape is about 1. For this reason, the shape anisotropy may be sufficiently smaller than the magnetic anisotropy field caused by the materials.

When the constant expressed by g', e, αdamp, h, and g in equation (3) is represented by A, and Ms·Hk/2 is represented by Ku, equation (4) is obtained.

$$J_{c0}^{P \to AP} = A \cdot t \cdot (K_u + 2\pi M_s^2) \quad (4)$$

When the write current density is represented by Jw in equation (4), $$J_{c0}^{P \to AP} = A \cdot t \cdot (K_u + 2\pi M_s^2) < J_w \quad (5)$$

must be satisfied.

To set the magnetization direction perpendicular to the film surface, a relationship given by $$K_u > 2\pi M_s^2 \quad (6)$$

must be satisfied.

From inequalities (5) and (6), the magnetic anisotropy energy density Ku must satisfy $$2\pi M_s^2 < K_u < \frac{1}{2}\left(\frac{J_w}{A \cdot t} - 2\pi M_s^2\right) \quad (7)$$

Figure 14A:
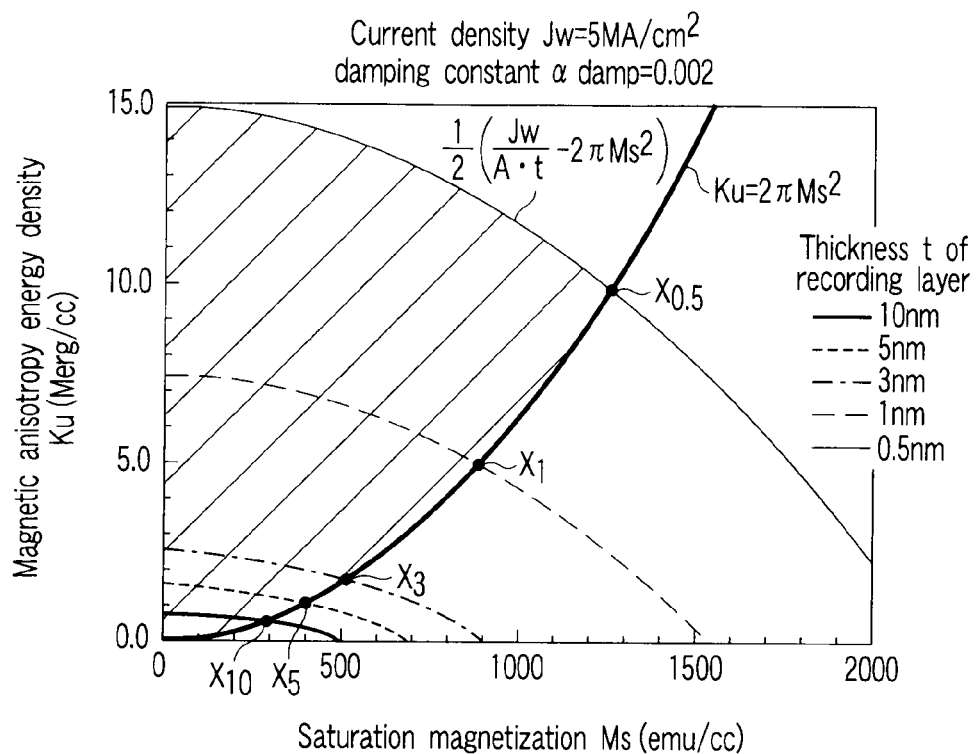
FIGS. 14A and 14B are graphs showing the relationship (damping constant=0.002) between the free layer thickness, saturation magnetization, and magnetic anisotropy energy according to an embodiment of the present invention.
Figure 14B:
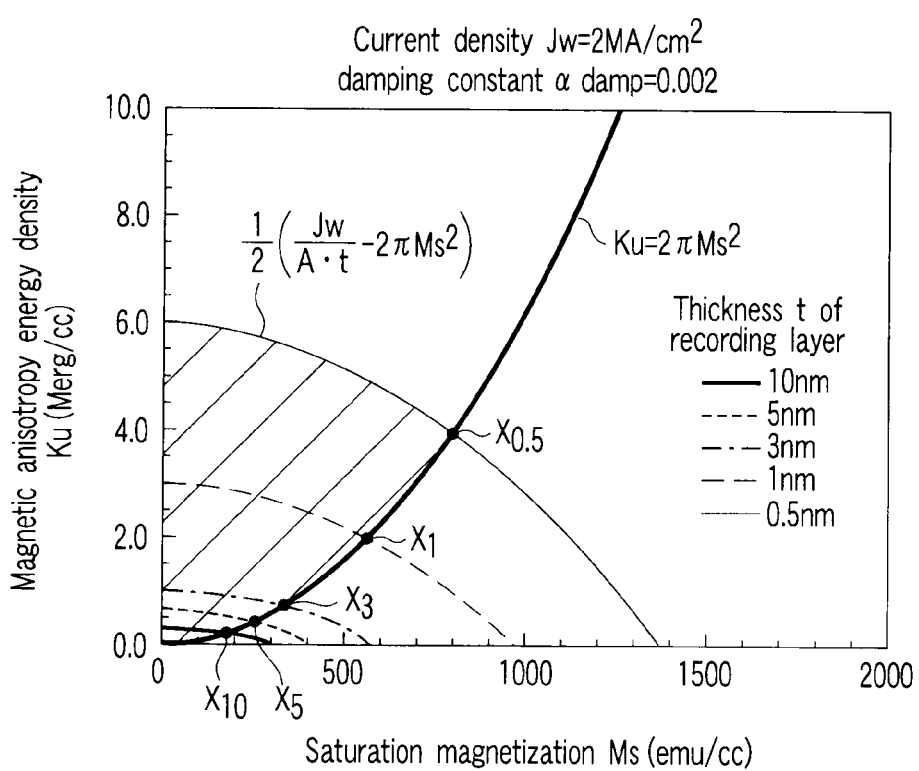

FIGS. 13A and 13B and FIGS. 14A and 14B show relationship (7) in detail. FIGS. 13A and 13B and FIGS. 14A and 14B show the relationship between the magnetic anisotropy energy density Ku, saturation magnetization Ms, and thickness t of the free layer according to an embodiment of the present invention. FIG. 13A and FIG. 14A show a case wherein the write current density Jw is 5 MA/cm². FIG. 13B and FIG. 14B show a case wherein the write current density Jw is 2 MA/cm². Examinations are done for the free layer 11 with the thickness t of 0.5 nm, 1 nm, 3 nm, 5 nm, or 10 nm.

To realize the write current density Jw of 5 or 2 MA/cm² described above, the magnetic anisotropy energy density Ku, saturation magnetization Ms, and thickness t of the free layer 11 must be set in the hatched regions shown in FIGS. 13A and 13B and FIGS. 14A and 14B.

The relationship between g(θ) and the polarization P of a giant magnetoresistive (GMR) with a nonmagnetic layer made of a conductive material such as Cu or Au and a tunneling magnetoresistive (TMR) with a nonmagnetic layer serving as a tunnel barrier can be given by the g-factor g' is 2.

$$g(\theta) = P/\{2 \times (1 + P^2 \times \cos\theta)\} \quad (8)$$

$$g(\theta) = \{-4 + (P^{-0.5} + P^{0.5})^3 \times (3 + \cos\theta)/4\}^{-1} \quad (9)$$

In obtaining the relationship shown in FIGS. 13A and 13B, for example, the damping constant αdamp was set to 0.01, and g(0) was set to 0.18. The upper limit of the magnetic anisotropy energy density Ku is defined by inequality (7). The first term is Jw/(2A·t). In FIGS. 14A and 14B, the damping constant αdamp was set to 0.002. These relationships are compared on the basis of the same thickness. When the damping constant αdamp decreases to 1/5, the range of magnetic anisotropy energy density Ku increases to 5 times, and the range of saturation magnetization Ms increases to √5 times. This is also apparent from inequality (7). The efficiency g(0) also changes the ranges of magnetic anisotropy energy density Ku and saturation magnetization Ms. To decide the appropriate ranges of the magnetic anisotropy energy density Ku and saturation magnetization Ms, the damping constant αdamp, thickness t, and the efficiency g(0) are important, as described above. According to equation (3), Jc is proportional to αdamp×t/g(0).

The damping constant αdamp of a magnetic material is about 0.001 to 0.5. The efficiency g(0) can be estimated from the polarization P, as indicated by equations (8) and (9). For current induced magnetization reversal, the polarization P is preferably 0.1 or more. The efficiency g(0) is about 0.026 and 0.05 for GMR and TMR, respectively. When the polarization P is 1, the efficiency g(0) is 0.25 for both GMR and TMR.

The thickness t of the free layer 11 will be examined next. The upper limit of the magnetic anisotropy energy density Ku decreases as the thickness t increases, as is apparent from inequality (7). When the thickness t increases, the magnetic anisotropy energy density Ku must be set small. In addition, to attain perpendicular magnetization, the saturation magnetization Ms also needs to be small. This can also be understood from FIGS. 13A and 13B, and 14A and 14B, and it is difficult to make the thickness of the free layer 11 larger than 5 nm. Hence, the thickness of the free layer 11 is preferably set to 5 nm or less. The thickness is also preferably 0.5 nm or more from the viewpoint of in-plane uniformity.

Hence, the thickness t of the free layer 11 preferably satisfies a relationship given by $$0.5 \text{ nm} \leq t \leq 5 \text{ nm} \quad (10)$$

For a case wherein the free layer 11 is made of an artificial lattice of one pair, the lower limit value of the thickness of the free layer 11 can be supposed to be 0.2 nm or more. In a layered film with the free layer 11 exchange-coupled through a nonmagnetic layer, the thickness corresponds to the thickness of each exchange-coupled layer.

When the range of αdamp×t/g(0) is considered from the above-described ranges of damping constant αdamp, efficiency g(0), and thickness t, $0.002 \leq \alpha_{damp} \times t/g(0) \leq 100$ holds. The unit of thickness t is nm. In consideration of this, relationships when the write current density Jw is 5 MA/cm² and 2 MA/cm² using αdamp×t/g(0) as a parameter are shown in FIGS. 15A and 15B, like FIGS. 13A and 13B, and 14A and 14B.

The magnetic anisotropy energy density Ku will be described next in consideration of the thickness t of the free layer 11, which is represented by inequality (10). To form a perpendicular magnetic film, the magnetic anisotropy energy density Ku must satisfy Ku>2πMs², as indicated by inequality (6). Magnetic materials capable of minimizing the saturation magnetization Ms are ferrimagnetic materials and antiferromagnetic materials, and they includes the above-described RE-TM alloy. The magnetic anisotropy energy density Ku of the RE-TM alloy is 1×10⁵ erg/cc or more. This can be regarded as the lower limit value of the magnetic anisotropy energy density Ku.

Figure 15A:
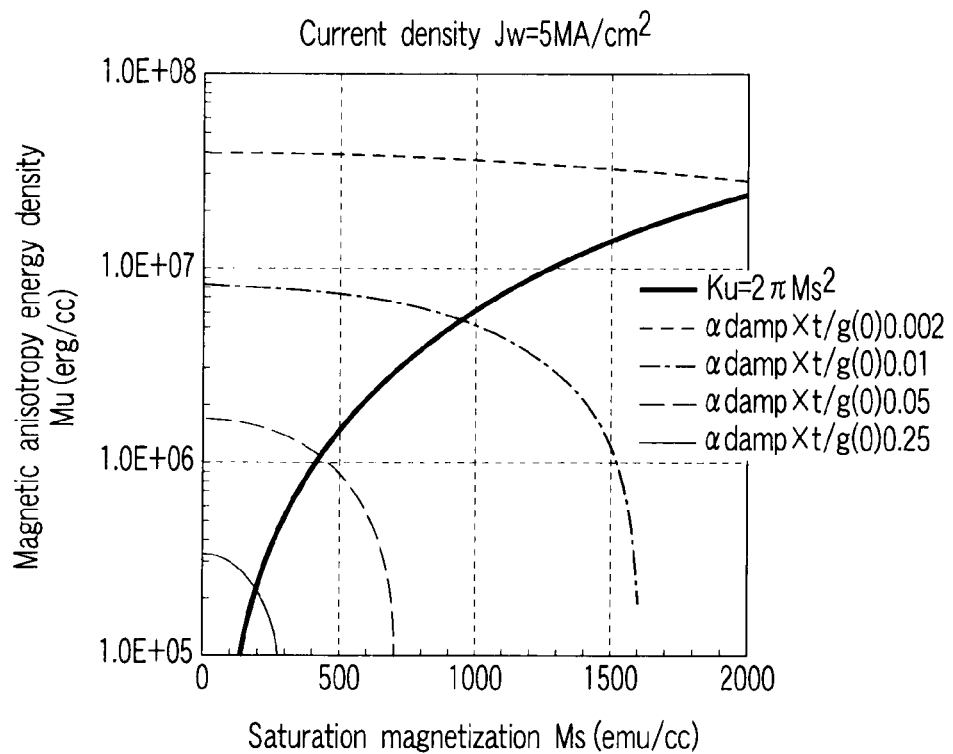
FIGS. 15A and 15B are graphs showing the relationship between the damping constant, saturation magnetization, and magnetic anisotropy energy according to an embodiment of the present invention.
Figure 15B:
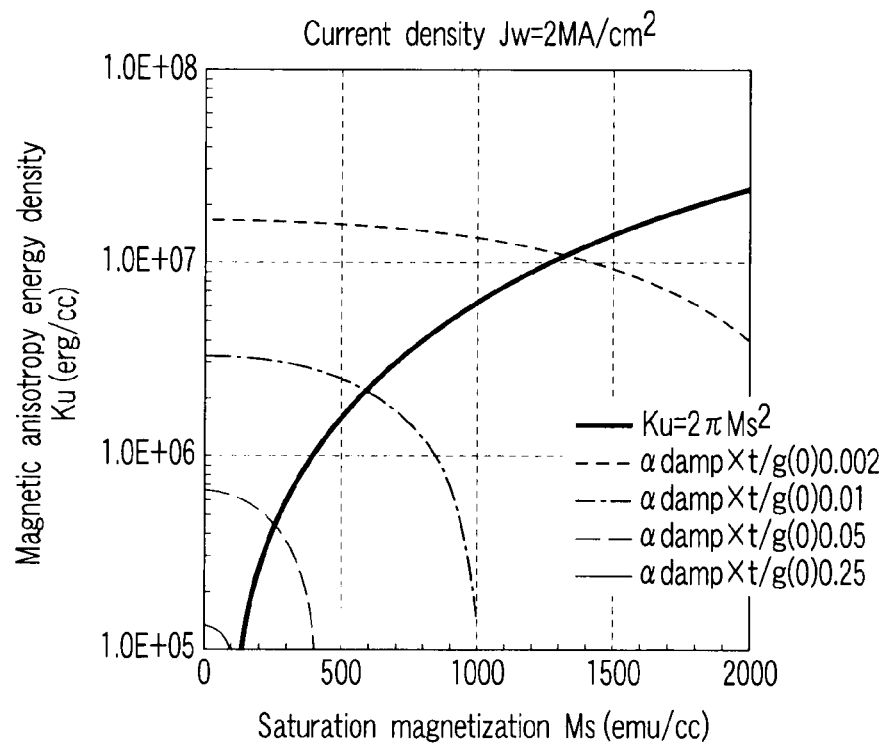

On the other hand, the upper limit value of the magnetic anisotropy energy density Ku can be derived from the relationship shown in FIGS. 15A and 15B. More specifically, as shown in FIG. 15A, when the write current density Jw is 5 MA/cm², 4.1×10⁷ erg/cc, i.e., the maximum value in the hatched region is the upper limit value of the magnetic anisotropy energy density Ku. As shown in FIG. 15B, when the write current density Jw is 2 MA/cm², 1.6×10⁷ erg/cc, i.e., the maximum value in the hatched region is the upper limit value of the magnetic anisotropy energy density Ku.

Hence, when the write current density Jw is 5 MA/cm² or less, the magnetic anisotropy energy density Ku preferably satisfies $$1\times10^5 \text{ erg/cc} \leq Ku \leq 4.1\times10^7 \text{ erg/cc} \quad (11)$$

When the write current density Jw is 2 MA/cm² or less, the magnetic anisotropy energy density Ku preferably satisfies $$1\times10^5 \text{ erg/cc} \leq Ku \leq 1.6\times10^7 \text{ erg/cc} \quad (12)$$

The saturation magnetization Ms will be described next in consideration of the thickness t of the free layer 11, which is represented by inequality (10). The saturation magnetization Ms can be derived from the relationship shown in FIGS. 15A and 15B. More specifically, as shown in FIG. 15A, when the write current density Jw is 5 MA/cm², the saturation magnetization Ms is preferably 0 to 2090 emu/cc. As shown in FIG. 15B, when the write current density Jw is 2 MA/cm², the saturation magnetization Ms is preferably 0 to 1320 emu/cc.

Hence, when the write current density Jw is 5 MA/cm² or less, the saturation magnetization Ms preferably satisfies $$0 \leq Ms \leq 2090 \text{ emu/cc} \quad (13)$$

When the write current density Jw is 2 MA/cm² or less, the saturation magnetization Ms preferably satisfies $$0 \leq Ms \leq 1320 \text{ emu/cc} \quad (14)$$

As described above, the write current density Jw is preferably 5 MA/cm² or less. In the range of the thickness t of the free layer 11 given by inequality (10), the magnetic anisotropy energy density Ku preferably falls within the range of $1\times10^5$ erg/cc to $4.1\times10^7$ erg/cc, and the saturation magnetization Ms preferably falls within the range of 0 to 2090 emu/cc. More preferably, the write current is 2 MA/cm² or less, the magnetic anisotropy energy density Ku falls within the range of $1\times10^5$ erg/cc to $1.6\times10^7$ erg/cc, and the saturation magnetization Ms falls within the range of 0 to 1320 emu/cc.

When the free layer 11 has a layered structure including a highly spin-polarized material and a magnetic layer, the entire layered structure is regarded as one magnetic layer, i.e., free layer. Let Ms1, Ms2, Ku1, Ku2, t1, and t2 respectively be the saturation magnetizations, magnetic anisotropy energy densities, and thicknesses of the highly spin-polarized material and magnetic layer of the free layer. The saturation magnetization Ms, magnetic anisotropy energy density Ku, and thickness t of the free layer (highly spin-polarized material and magnetic layer) can be estimated by $$Ms=(Ms1\times t1+Ms2\times t2)/t \quad (15)$$

$$Ku=(Ku1\times t1+Ku2\times t2)/t \quad (16)$$

$$t=t1+t2 \quad (17)$$

They can be estimated in the same way even when the free layer includes three or more layers.

The highly spin-polarized material is actually Fe, Co, Ni, or an alloy containing at least one of these elements, and the saturation magnetization is at least 500 emu/cc. The highly spin-polarized material plays a role to increase the MR ratio. For this purpose, the highly spin-polarized material preferably has a thickness of 0.5 nm or more. Of magnetic materials used to form a perpendicular magnetic film, an RE-TM alloy can decrease saturation magnetization. As described above, saturation magnetization is zero in a compensation composition in which the magnetic moments of RE and TM equal. For example, assume that a highly spin-polarized material having the saturation magnetization Ms1 of 800 emu/cc, the thickness t1 of 0.5 nm, and the anisotropy energy density Ku1 of 1,000 erg/cc, and a magnetic layer having the saturation magnetization Ms2 of 0 emu/cc and the anisotropy energy density Ku 2 of 5×10⁵ erg/cc are stacked. According to estimation based on the above-described equations, when the thickness t2 of the magnetic layer is 1.2 nm, the anisotropy energy density of the free layer highly spin-polarized material and magnetic layer) is 3.53×10⁵ erg/cc, the saturation magnetization is 235 emu/cc, and the thickness is 1.7 nm. Ku>2πMs² is satisfied, it is a condition to form a perpendicular magnetic film.

Examination will be done next with an emphasis on the saturation magnetization Ms of the free layer 11. Consider a case wherein the lower and upper limit values equal in inequality (7) described above. That is, intersections Xt (t=0.5, 1, 3, 5, and 10) shown in FIGS. 15A and 15B are obtained. In consideration of the fact that the saturation magnetization Ms is preferably smaller than the intersection Xt, a relationship given by $$Ms<\sqrt{\{Jw/(6\pi At)\}} \quad (18)$$

can be derived.

As described above, when the free layer 11 has a layered structure of an RE-TM alloy, the saturation magnetization Ms is zero. Hence, the lower limit value of the saturation magnetization Ms can be regarded as zero.

Hence, by using the write current density Jw, the thickness t of the free layer 11, and a constant A, the saturation magnetization Ms of the free layer 11 is given by $$0 \leq Ms \leq \sqrt{\{Jw/(6\pi At)\}} \quad (19)$$

$$A=g'\cdot e\cdot \alpha/(h/2\pi \times g) \quad (20)$$

where g' is a g-factor, e is the elementary charge, α is the Gilbert's damping constant, h is the Planck's constant, and g is the spin transfer efficiency when magnetizations of two magnetic materials are arranged parallel.

Detailed examples considering the above-described write current density Jw and the like will be described below.

(a) Detailed Example 4-1

An MTJ element of Detailed Example 4-1 has a layered structure similar to that of Detailed Example 1-4 shown in FIG. 3. A free layer 11 and a pinned layer 12 are made of an RE-TM alloy.

The layered structure of Detailed Example 4-1 of an MTJ element 10 will be described below. A lower electrode 14 is made of a 5-nm thick Ta film and a 5-nm thick Ru film. In Detailed Example 4-1, no layer corresponding to the underlayer 15 is present. The pinned layer 12 is made of a 30-nm thick $Tb_{21}(CO_{84}Fe_{16})_{79}$ film. A first highly spin-polarized layer 18 is made of a 2.0-nm thick $CO_{40}Fe_4O_{20}$ film. A tunnel barrier layer TB is made of a 0.7-nm thick MgO film. A second highly spin-polarized layer 19 is made of a 1.0-nm thick $CO_{40}Fe_4O_{20}$ film. The free layer 11 is made of a 5-nm thick $Tb_{30}(CO_{84}Fe_{16})_{70}$ film. $Tb_{23}(CO_{84}Fe_{16})_{77}$ has a compensation composition. A cap layer 16 is made of a 3-nm thick Ru film. An upper electrode 17 is made of a layered film obtained by forming a 5-nm thick Ta film, a 5-nm thick Ru film, and a 100-nm thick Ta film in an order named.

The MTJ element 10 was fabricated to an element size of 0.14 μm×0.28 μm, and the R-H loop was measured by a 4-terminal method. The coercive force of the pinned layer 12 was 9.5 kOe, and the coercive force of the free layer 11 was 6.5 kOe. The saturation magnetization Ms was measured before fabrication from the MH loop by using a vibrating sample magnetometer. The saturation magnetization Ms of the pinned layer 12 was 100 emu/cc, and the saturation magnetization Ms of the free layer 11 was 80 emu/cc. The pinned layer 12 and first highly spin-polarized layer 18 are exchange-coupled and behave as one magnetic layer. The free layer 11 and second highly spin-polarized layer 19 are exchange-coupled and behave as one magnetic layer. Hence, the above-described coercive forces and saturation magnetizations are values obtained when the layers are regarded as single magnetic materials.

The saturation magnetization and magnetic anisotropy energy density of each of the free layer 11 and second highly spin-polarized layer 19 are as follows. The saturation magnetization Ms2 and magnetic anisotropy energy density Ku2 of the free layer 11 are −200 emu/cc and $5 \times 10^5$ erg/cc, respectively. The saturation magnetization Ms1 and magnetic anisotropy energy density Ku1 of the second highly spin-polarized layer 19 are 1,200 emu/cc and $1 \times 10^4$ erg/cc, respectively. The saturation magnetization Ms2 of the free layer 11 is expressed as a negative value because the direction of the magnetic moment of TM is defined as positive. In Detailed Example 4-1, the magnetic moment of RE is larger than that of TM, and the magnetic moment of the RE-TM alloy is directed in a reverse direction to that of TM. The saturation magnetization Ms and magnetic anisotropy energy density Ku of the entire layer are 33 emu/cc and $4.2 \times 10^5$ erg/cc, respectively, as is estimated from equations (15) to (17). The anisotropy field is estimated to be 25 kOe, i.e., larger than the measured coercive force. The coercive force is smaller than the anisotropy field probably because a reversing nucleus is formed due to the ununiformity of film properties, and magnetization reversal occurs by magnetic domain wall movement. The saturation magnetization shifts probably because no composition as set is obtained due to interdiffusion of CoFeB and TbCoFe.

The MR ratio of the MTJ element 10 is 30% because of contribution of the highly spin-polarized layers 18 and 19. When current induced magnetization reversal is caused in this element, the reversal current density from the antiparallel (AP) state to the parallel (P) state is $4.5 \times 10^6$ A/cm$^2$. The reversal current density from the antiparallel state to the parallel state is measured to avoid irreversible breakdown of the element in evaluation because $g(\pi) > g(0)$, as is apparent from equation (9), and the reversal current density is expected to be smaller than that from the parallel state to the antiparallel state.

The damping constant αdamp of Gd—CoFe as an example of RE-TM is reported to be about 0.1. Tb—CoFe of the free layer 11 of Detailed Example 4-1 is also expected to be almost the same. The MR ratio is about 20% at writing because of its bias voltage dependence, and $g(\pi)$ is expected to be about 0.165. When the damping constant αdamp is 0.1, $g(\pi)$ is 0.165, the saturation magnetization Ms is 117 emu/cc, the magnetic anisotropy energy density Ku is $4.2 \times 10^5$ erg/cc, and the thickness is 6 nm, the reversal current can be estimated to be $9.4 \times 10^7$ A/cm$^2$. On the other hand, the actually measured reversal current density is $4.5 \times 10^6$ A/cm$^2$, as described above, i.e., largely different from the estimation.

On the basis of this result, the present inventor paid attention to the effect of the second highly spin-polarized layer 19 formed on the free layer 11 made of Tb—CoFe. The damping constant αdamp of $CO_{40}Fe_{40}B_{20}$ of the second highly spin-polarized layer 19 is supposed to be about 0.008. The reversal current density estimated in this case is $8.2 \times 10^6$ A/cm$^2$. That is, the values exhibit relatively good agreement. More specifically, when a magnetic material having a small damping constant αdamp ($CO_{40}Fe_4O_{20}$: αdamp=0.008 used in the second highly spin-polarized layer 19) and a magnetic material having a large damping constant αdamp (Tb—CoFe: αdamp=0.1 used in the free layer 11) are stacked, the magnetic material with the small damping constant αdamp receives a larger spin torque as compared to the magnetic material with the large damping constant αdamp. This triggers reversal, and the reversal current density decreases.

As described above, when a magnetic material with a small damping constant αdamp and a magnetic material with a large damping constant αdamp are stacked, the reversal current density can be reduced. An example of the material with a small damping constant αdamp is Fe. The damping constant αdamp of Fe is reported to be about 0.002. The polarization P of Fe is reported to be about 0.4. For this reason, the above-described index αdamp×t/g(0) is estimated to be about 0.01 by setting the thickness t (nm) to 1 nm. The saturation magnetization Ms and magnetic anisotropy energy density Ku when the index αdamp×t/g(0) is 0.01 are estimated from FIGS. 15A and 15B. When Jw=5 MA/cm$^2$, preferably, Ms<934 emu/cc, and Ku<$8.2 \times 10^6$ erg/cc. When Jw=2 MA/cm$^2$, preferably, Ms<591 emu/cc, and Ku<$3.3 \times 10^6$ erg/cc.

The above-described layered structure of a magnetic material with a small damping constant αdamp and a magnetic material with a large damping constant αdamp is merely an example. For example, the following forms may be employed.

A magnetic material with a small damping constant αdamp and a magnetic material with a large damping constant αdamp may be mixed. For example, as shown in FIGS. 16A and 16B, a material with a small damping constant αdamp may be dispersed in a base material made of a material with a large damping constant αdamp. Alternatively, as shown in FIGS. 16C and 16D, a material with a large damping constant αdamp may be dispersed in a base material made of a material with a small damping constant αdamp. In FIGS. 16B and 16D, the dispersed material has a cylindrical shape. However, the present invention is not limited to this. The material shape can be, e.g., a sphere, cuboid, or cube, and fundamentally, the shape is not limited.

As is apparent from equation (1), the reversal current density can further be reduced effectively by reducing the volume of the free layer. For example, a layered film including a film (so-called granular film) in which a material with a small damping constant αdamp is dispersed and a material with a large damping constant αdamp may be used. Alternatively, a layered film including a film (so-called granular film) in which a material with a large damping constant αdamp is dispersed and a material with a small damping constant αdamp may be used. In addition, a layered film including a film (so-called granular film) in which a material with a small damping constant αdamp is dispersed and a film (so-called granular film) in which a material with a large damping constant αdamp is dispersed may be used.

To form a perpendicular magnetization film, a material with a relatively large perpendicular magnetic anisotropy energy must be used. The damping constant αdamp of a material having a large magnetic anisotropy is larger than that of an alloy material containing Co, Fe, or Ni used as a highly spin-polarized material. Hence, a layered structure of a material with a small damping constant αdamp and a material with a large damping constant αdamp is more preferable for current induced magnetization reversal of a perpendicular magnetization film.

Detailed examples of a material with a small damping constant αdamp and a material with a large damping constant αdamp as described above will be explained below.

An example of a magnetic material with a small damping constant αdamp is a Fe-based magnetic alloy with a low damping constant. An example of the magnetic alloy is an alloy containing at least Fe. The content of Fe is preferably at least 40 at %. As the magnetic alloy, a Heusler alloy known as a half metal material may be used, and examples are $CO_2MnSi$, $CO_2MnGe$, $CO_2CrAl$, $CO_2(Cr-Fe)Al$, and $CO_2FeSi$.

An example of a magnetic material with a large damping constant αdamp is a $L1_0$ magnetic alloy with a large magnetic anisotropy energy. An example of the magnetic alloy is an alloy mainly containing one of Fe—Pt, Fe—Pd, Co—Pt, Co—Pd, and Mn—Al. As the magnetic alloy, a ternary alloy such as Fe—Pt—X, Fe—Pd—X, or Co—Pt—X or an alloy containing four or more elements may be used.

As a magnetic material with a small or large damping constant αdamp, a material having a lattice constant a that matches better with an MgO (100) plane is preferably used. Detailed examples are as follows. For example, as a material with a lattice constant of 0.9a to 1.1a or $0.9 \times \sqrt{2}a$ to $1.1 \times \sqrt{2}a$ on the (001) plane of a cubic or tetragonal structure, a material having a face-centered cubic structure or face-centered tetragonal structure and an a-axis lattice constant within the range of 3.79 A to 4.63 A or 5.36 A to 6.55 A is preferably used. As a material with a lattice constant of $0.9 \times \sqrt{2}/2a$ to $1.1 \times \sqrt{2}/2a$ on the (001) plane of a cubic or tetragonal structure, a material having a body-centered cubic structure or body-centered tetragonal structure and an a-axis lattice constant within the range of 2.68 A to 3.28 A is preferably used.

In the above description, the magnitude relationship between a material with a large damping constant αdamp and a material with a small damping constant αdamp may hold on the basis of comparison of the damping constants αdamp of the two materials. Alternatively, a reference value (e.g., 0.01) of the damping constant αdamp may be defined so that a material with a damping constant larger than the reference value is defined as a material with a large damping constant αdamp while a material with a damping constant smaller than the reference value is defined as a material with a small damping constant αdamp.

As described in Detailed Example 4-1, when a magnetic layer with a large damping constant αdamp and a magnetic layer with a small damping constant αdamp are stacked, the material with a large damping constant αdamp preferably has a perpendicular magnetic anisotropy energy and is magnetized in a direction perpendicular to the film surface. The material with a small damping constant αdamp preferably has a small anisotropy energy to be readily influenced by the perpendicular magnetic anisotropy of the magnetic layer with the large damping constant αdamp. The material with a small damping constant αdamp is preferably exchange-coupled to the material with a large damping constant αdamp. A material having a perpendicular magnetic anisotropy and a small damping constant αdamp may be used, as a matter of course.

When a magnetic layer with a large damping constant αdamp and a magnetic layer with a small damping constant αdamp are stacked, the magnetic layer with a small damping constant αdamp is preferably located on the side of the tunnel barrier layer TB. For example, in the structure shown in FIG. 3, preferably, a magnetic layer with a small damping constant αdamp is provided at the location of the second highly spin-polarized layer 19, and a magnetic layer with a large damping constant αdamp is provided at the location of the free layer 11. With this structure, the effect of reducing the reversal current density can be increased. The magnetic layer with large damping constant αdamp may be arranged on the side of the tunnel barrier layer TB. A layered structure including the tunnel barrier layer TB/second highly spin-polarized layer 19/magnetic layer with a small damping constant αdamp/magnetic layer with a large damping constant αdamp may be formed.

The number of layers included in the layered structure of a magnetic layer with a large damping constant αdamp and a magnetic layer with a small damping constant αdamp is not limited to two. The number of layers may be three or more. Even in this case, the magnetic layer with a small damping constant αdamp is preferably located on the side of the tunnel barrier layer TB, as described above.

When the MTJ element 10 has a dual pin structure, the free layer 11 is sandwiched between the nonmagnetic layers 13a and 13b. A magnetic layer with a small damping constant αdamp is preferably located on each of the interfaces between the free layer 11 and the nonmagnetic layers 13a and 13b. For example, in the structure shown in FIG. 10, preferably, a magnetic layer with a small damping constant αdamp is provided at the location of the highly spin-polarized layer 18 near the tunnel barrier layer TB, and a magnetic layer with a large damping constant αdamp is provided at the location of the free layer 11. The highly spin-polarized material is located on the side of the tunnel barrier layer TB from the viewpoint of the MR ratio. Another magnetic layer with a small damping constant αdamp may be provided between the free layer 11 and the nonmagnetic layer 13a. The spin torque preferably effectively words on both interfaces of the free layer 11 so that the MR ratios to the nonmagnetic layers 13a and 13b need to have a difference.

(b) Detailed Example 4-2

An MTJ element of Detailed Example 4-2 has the same layered structure as that of Detailed Example 1-2 shown in FIG. 3. A free layer 11 is made of an RE-TM alloy. A pinned layer 12 is made of CoPtCr.

The layered structure of Detailed Example 4-2 of an MTJ element 10 will be described below. A lower electrode 14 is made of a 10-nm thick Ta film. An underlayer 15 is made of a 5-nm thick Ru film. The pinned layer 12 is made of a 30-nm thick $(CO_{78}Pt_{12}Cr_{10})_{85}-(SiO_2)_{15}$ film with a (002) plane being oriented. A first highly spin-polarized layer 18 is made of a 2.0-nm thick $CO_{62}Fe_{22}B_{16}$ film. A tunnel barrier layer TB is made of a 1.0-nm thick MgO film. A second highly spin-polarized layer 19 is made of a 1.0-nm thick $CO_{60}Fe_2O_{20}$ film. The free layer 11 is made of a 4-nm thick $Tb_{21}(CO_{84}Fe_{16})_{79}$ film. $Tb_{21}(CO_{84}Fe_{16})_{79}$ has a compensation composition. A cap layer 16 is made of a 3-nm thick Pt film. An upper electrode 17 is made of a layered film obtained by forming a 5-nm thick Ta film, 5-nm thick Ru film, and a 100-nm thick Ta film in an order named.

The MTJ element 10 was fabricated to an element size of 0.1 μm×0.1 μm, and the R-H loop was measured by a 4-terminal method. The coercive force of the pinned layer 12 was 4.0 kOe, and the coercive force of the free layer 11 was 1,200 Oe. The saturation magnetization Ms was measured before fabrication from the MH loop by using a vibrating sample magnetometer. The saturation magnetization Ms of the pinned layer 12 was 500 emu/cc, and the saturation magnetization Ms of the free layer 11 was 400 emu/cc. The pinned layer 12 and first highly spin-polarized layer 18 are exchange-coupled and behave as one magnetic layer. The free layer 11 and second highly spin-polarized layer 19 are exchange-coupled and behave as one magnetic layer. Hence, the above-described coercive forces and saturation magnetizations are values obtained when the layers are regarded as single magnetic materials.

The saturation magnetization and magnetic anisotropy energy density of each of the free layer 11 and second highly spin-polarized layer 19 are as follows. The saturation magnetization Ms2 and magnetic anisotropy energy density Ku2 of the free layer 11 are 100 emu/cc and $7\times10^5$ erg/cc, respectively. The saturation magnetization Ms1 and magnetic anisotropy energy density Ku1 of the second highly spin-polarized layer 19 are 1,100 emu/cc and $1\times10^4$ erg/cc, respectively. The saturation magnetization Ms and magnetic anisotropy energy density Ku of the entire layer are 300 emu/cc and $5.6\times10^5$ erg/cc, respectively, as is estimated from equations (15) to (17). The anisotropy field is estimated to be 3.7 kOe, i.e., larger than the measured coercive force. The coercive force is smaller than the anisotropy field probably because a reversing nucleus is formed due to the ununiformity of film properties, and magnetization reversal occurs by magnetic domain wall movement.

The MR ratio of the MTJ element 10 is 120% because of contribution of the highly spin-polarized layers 18 and 19. When current induced magnetization reversal is caused in this element, the current density is $8.4\times10^6$ A/cm$^2$.

To further reduce the current density, the MTJ element 10 with the following structure was examined. The second highly spin-polarized layer 19 is made of a 0.5-nm thick $Ni_{80}Fe_{20}$ film. The free layer 11 is made of a 2-nm thick $Tb_{26}(Co_{84}Fe_{16})_{74}$ film. When the R-H loop and MH loop were measured by the same methods as described above, the coercive force and the saturation magnetization of the free layer 11 were 1,400 Oe and 70 emu/cc, respectively. The saturation magnetization Ms1 and magnetic anisotropy energy density Ku1 of $Ni_{80}Fe_{20}$ were 800 emu/cc and 1,000 erg/cc, respectively. The saturation magnetization Ms2 and magnetic anisotropy energy density of the 2-nm thick $Tb_{26}(Co_{84}Fe_{16})_{74}$ film were 100 emu/cc and $5.0\times10^5$ erg/cc, respectively. The saturation magnetization Ms and magnetic anisotropy energy density Ku of the entire free layer 11 including the second highly spin-polarized layer 19 are estimated to be 80 emu/cc and $4.0\times10^5$ erg/cc, as described above. The anisotropy field is estimated to be 10 kOe. In this case, the MR ratio of the MTJ element 10 is 60% because of contribution of the highly spin-polarized layers 18 and 19. When current induced magnetization reversal is caused in this element, the current density is $2.7\times10^6$ A/cm$^2$.

(c) Detailed Example 4-3

An MTJ element of Detailed Example 4-3 has the same layered structure as that of Detailed Example 1-2 shown in FIG. 3. A free layer 11 is made of an artificial lattice. A pinned layer 12 is made of FePt.

The layered structure of Detailed Example 4-3 of an MTJ element 10 will be described below. A lower electrode 14 is made of a 10-nm thick Ta film. An underlayer 15 is made of a 10-nm thick Pt film formed on a 0.3-nm thick MgO film. The MgO/Pt layered film has a (001) plane oriented. The pinned layer 12 is made of a 20-nm thick $Fe_{50}Pt_{50}$ film with a (001) plane being oriented. A first highly spin-polarized layer 18 is made of a 1.5-nm thick $Co_{62}Fe_{22}B_{16}$ film. A tunnel barrier layer TB is made of a 0.8-nm thick MgO film. The MgO film has a (001) plane oriented. A second highly spin-polarized layer 19 is made of a 0.3-nm thick Co film. The film formation conditions are adjusted such that a Co (001) plane with a bcc structure is formed. The free layer 11 is made of an artificial lattice [Pt/CoCr]2 formed by stacking two periods each including a 2.0-nm thick Pt film and a 0.3-nm thick $Co_{80}Cr_{20}$ film. A cap layer 16 is made of a 3-nm thick Pt film. An upper electrode 17 is made of a layered film obtained by forming a 5-nm thick Ta film, 5-nm thick Ru film, and a 100-nm thick Ta film in an order named.

The MTJ element 10 was fabricated to an element size of 0.1 μm×0.1 μm, and the R-H loop was measured by a 4-terminal method. The coercive force of the pinned layer 12 was 7.0 kOe, and the coercive force of the free layer 11 was 1,000 Oe. The saturation magnetization was measured before fabrication from the MH loop by using a vibrating sample magnetometer. The saturation magnetization of the pinned layer 12 was 1,000 emu/cc, and the saturation magnetization of the free layer 11 was 220 emu/cc. The pinned layer 12 and first highly spin-polarized layer 18 are exchange-coupled and behave as one magnetic layer. The free layer 11 and second highly spin-polarized layer 19 are exchange-coupled and behave as one magnetic layer. Hence, the above-described coercive forces and saturation magnetizations are values obtained when the layers are regarded as single magnetic materials.

The saturation magnetization and magnetic anisotropy energy density of each of the free layer 11 and second highly spin-polarized layer 19 are as follows. The saturation magnetization Ms2 and magnetic anisotropy energy density Ku2 of the free layer 11 are 140 emu/cc and $5\times10^5$ erg/cc, respectively. The saturation magnetization Ms1 and magnetic anisotropy energy density Ku1 of the second highly spin-polarized layer 19 are 1,400 emu/cc and $1\times10^6$ erg/cc, respectively. The saturation magnetization Ms and magnetic anisotropy energy density Ku of the entire layer are 220 emu/cc and $5.3\times10^5$ erg/cc, respectively, as is estimated from equations (15) to (17). The saturation magnetization of the artificial lattice is converted from the thickness of the entire Pt/CoCr film. The anisotropy field is estimated to be 4.9 kOe, i.e., larger than the measured coercive force. The coercive force is smaller than the anisotropy field probably because a reversing nucleus is formed due to the ununiformity of film properties, and magnetization reversal occurs by magnetic domain wall movement.

The MR ratio of the MTJ element 10 is 80% because of contribution of the highly spin-polarized layers 18 and 19. When current induced magnetization reversal is caused in this element, the current density is $7.7\times10^6$ A/cm$^2$.

(d) Detailed Example 4-4

An MTJ element of Detailed Example 4-4 has the same layered structure as that of Detailed Example 1-2 shown in FIG. 3. A free layer 11 is made of an RE-TM alloy. A pinned layer 12 is made of CoPtCr.

The layered structure of Detailed Example 4-4 of an MTJ element 10 will be described below. Detailed Example 4-3 is the same as Detailed Example 4-1 except a second highly spin-polarized layer 19 and free layer 11. As the second highly spin-polarized layer 19, a 0.5-nm thick $CO_{72}Fe_8B_{20}$ is used. The free layer 11 formed on it is made of a 2-nm thick $Tb_{26}(CO_{83}Fe_{17})_{74}$ film. A cap layer 16 is made of a 3-nm thick Pt film. An upper electrode 17 is made of a layered film obtained by forming a 5-nm thick Ta film, 5-nm thick Ru film, and a 100-nm thick Ta film in an order named.

The MTJ element 10 was fabricated to an element size of 0.1 μm×0.1 μm, and the R-H loop was measured by a 4-terminal method. The coercive force of the free layer 11 was 800 Oe. The saturation magnetization Ms was measured before fabrication from the MH loop by using a vibrating sample magnetometer. The saturation magnetization Ms of the free layer 11 was almost 0 emu/cc. In an RE-TM alloy, the magnetic moments of RE and TM cancel each other. If an RE-TM alloy and an alloy containing TM are stacked, TMs are exchange-coupled, as described above. Even in Detailed Example 4-3, when $Tb_{26}(CO_{83}Fe_{17})_{74}$ rich in Tb and $CO_{72}Fe_8B_{20}$ are stacked, the magnetic moment of Tb, which remains without being canceled by the magnetic moment of the RE-TM alloy, and the magnetic moment of $CO_{72}Fe_8B_{20}$ cancel each other so that the materials behave as a magnetic material having a magnetization of 0 emu/cc. Even by measuring using a vibrating sample magnetometer, the magnetic moment was not detected because its level was almost the same as the noise level.

The saturation magnetization and magnetic anisotropy energy density of each of the free layer 11 and second highly spin-polarized layer 19 are as follows. The saturation magnetization Ms2 and magnetic anisotropy energy density Ku2 of the free layer 11 are 250 emu/cc and $5 \times 10^5$ erg/cc, respectively. The saturation magnetization Ms1 and magnetic anisotropy energy density Ku1 of the second highly spin-polarized layer 19 are 1,000 emu/cc and $1 \times 10^4$ erg/cc, respectively. The saturation magnetization Ms and magnetic anisotropy energy density Ku of the entire layer are 0 emu/cc and $4.0 \times 10^5$ erg/cc, respectively, as is estimated from equations (13) to (15). In this estimation, the directions of saturation magnetization cancel each other. Hence, the saturation magnetization of the free layer 11 is handled as a negative value, i.e., −250 emu/cc for convenience.

The MR ratio of the MTJ element 10 is 100% because of contribution of the highly spin-polarized layers 18 and 19. When current induced magnetization reversal is caused in this element, the current density is $1.6 \times 10^6$ A/cm². As described above, reducing the saturation magnetizations by canceling them in the entire structure is effective for current reduction.

A magnetic parameter serving as an index of magnetization reversal is a coercive force Hc. Hc=Hk when magnetization reversal occurs ideally in a single magnetic domain. However, since no single magnetic domain is obtained actually, Hc is smaller than about 0.3 time of Hk. In the above-described detailed examples, Hk is actually larger than the coercive force Hc and satisfies Hk>4πMs. Hk can be evaluated by Hk=2Ku/Ms from the magnetic anisotropy energy density Ku by a torque meter.

In Detailed Examples 4-1 to 4-4 described above, the MTJ element 10 with a single pin structure has been exemplified. The relationships given by equations (1) to (20) and those shown in FIGS. 13A to 15B can also be applied to a dual pin structure.

[2] Magnetoresistive Random Access Memory

Examples in which the above-described MTJ element 10 of perpendicular magnetization type is applied to a magnetoresistive random access memory as a memory element of a memory cell will be described next.

(a) First Embodiment

The first embodiment is an example of a magnetoresistive random access memory having a select transistor memory cell.

FIG. 17 is a schematic sectional view showing a magnetoresistive random access memory according to the first embodiment of the present invention. The magnetoresistive random access memory according to the first embodiment will be described below.

As shown in FIG. 17, a gate insulating film 62 is formed on a semiconductor substrate 61. A gate electrode 63 is formed on the gate insulating film 62. Source/drain diffusion layers 64a and 64b are formed in the semiconductor substrate 61 on both sides of the gate electrode 63. A transistor Tr functioning as a read switching element is thus provided.

A lead wiring 66 is connected to the drain diffusion layer 64b through a contact 65. A lower wiring 14 is formed on the lead wiring 66. An MTJ element 10 of perpendicular magnetization type is formed on the lower wiring 14. An upper wiring 17 is formed on the MTJ element 10. An wiring 67 is formed on the upper wiring 17. On the other hand, an wiring 69 is connected to the source diffusion layer 64a through a contact 68.

When the MTJ element 10 is formed on the lead wiring 66, the lower electrode 14 is preferably formed at one end of the MTJ element 10. The lower electrode 14 need only ensure electrical conduction between the MTJ element 10 and the transistor Tr and is preferably made of a material with a low resistivity. Since the MTJ element 10 is formed on the lower electrode 14, a material with a smoothness as high as possible is preferably formed. For example, Ta or TaN or a layered film thereof is used. After formation of the lower electrode 14, a planarization process by chemical mechanical polish (CMP) may be executed to improve the smoothness.

The write operation is executed in the following way. First, the MTJ element 10 is selected from a plurality of MTJ elements of the memory cell array by using the switching element. More specifically, the potential of the gate electrode 63 of the transistor Tr connected to the MTJ element 10 is turned on. With this operation, a write current flows from the wiring 67 to the wiring 69 or from the wiring 69 to the wiring 67. Spin-polarized electrons are injected to the MTJ element 10 by the write current so that a spin injection write is implemented.

The read operation is executed in the following way. In the read operation, a read current is supplied from the wiring 67 to the wiring 69 or from the wiring 69 to the wiring 67 through the same route as in the above-described write operation. The tunnel resistance of the MTJ element 10 is read out, and "1"/"0" determination is done.

According to the first embodiment, by using the MTJ element 10 of perpendicular magnetization type, the MTJ element 10 can be microfabricated without increasing a reversal current. The reversal current does not increase even when the MTJ element 10 is microfabricated. For this reason, a large-capacity (e.g., 256 Mbits or more) magnetoresistive random access memory having the fine MTJ element 10 of 90 nm or less can be implemented, although it is impossible in a conventional magnetoresistive random access memory. Furthermore, when the spin injection write is employed, the write and read can be done through the same route, and the cell area can greatly be reduced.

(b) Second Embodiment

When the MTJ element 10 is used, the leakage field from each magnetic layer may influence adjacent cells. In the second embodiment, to reduce the influence of the leakage field, soft magnetic films are provided on wirings.

FIG. 18 is a schematic sectional view showing a magnetoresistive random access memory according to the second embodiment of the present invention. The magnetoresistive random access memory according to the second embodiment will be described below.

As shown in FIG. 18, soft magnetic films 71, 72, and 73 are provided on wirings 66, 67, and 69 located on the upper and lower sides of an MTJ element 10. More specifically, the soft magnetic film 73 covers the lower surface of the wiring 67 on the side of the MTJ element 10. The soft magnetic film 72 covers the upper surface of the lead wiring 66 on the side of the MTJ element 10. The soft magnetic film 71 covers the upper surface of the wiring 69 on the side of the MTJ element 10.

The soft magnetic films 71, 72, and 73 are different from a magnetic yoke wiring structure known for MRAMs. More specifically, a magnetic yoke is provided to efficiently supply, to an MTJ element, a magnetic field generated from a current flowing to the write wiring. Hence, the magnetic yoke does not cover the entire surface of the write wiring, i.e., is not provided on the surface of the write wiring opposing the MTJ element. However, the soft magnetic films 71, 72, and 73 of this embodiment are provided to suppress the influence of a leakage field generated from the MTJ element 10 on the neighboring wirings. That is, the soft magnetic films 71, 72, and 73 of this embodiment aim at absorbing the leakage field from the MTJ element 10. For this purpose, the soft magnetic films 71, 72, and 73 are provided on the lower surface of the wiring 67 located above the MTJ element 10 and the upper surfaces of the wirings 66 and 69 located under the MTJ element 10, unlike the yoke wiring.

The formation positions of the soft magnetic films 71, 72, and 73 are not limited to the upper or lower surfaces of the wirings 66, 67, and 69. For example, the soft magnetic films 71, 72, and 73 may also be formed on the side surfaces of the wirings 66, 67, and 69 or cover all outer surfaces of the wirings 66, 67, and 69. The soft magnetic films may be formed not only on the wirings 66, 67, and 69 but also at a given part such as a base close to the MTJ element 10. For example, soft magnetic films may sandwich the MTJ element 10 from upper and lower sides (direction of thickness). A soft magnetic film may be formed in contact with the side surface of the MTJ element 10. In this case, a soft magnetic film with no conductivity (insulator) is preferably used to prevent any short circuit between the free layer and the pinned layer of the MTJ element 10.

The soft magnetic films 71, 72, and 73 are made of at least one element of Ni, Fe, and Co, or a magnetic layer of an alloy containing at least one of them. For example, NiFe is preferably used. However, CoNi or FeCo can also be used. The soft magnetic films 71, 72, and 73 may have a so-called SAF structure such as NiFe/Ru/NiFe.

According to the above-described second embodiment, the same effect as in the first embodiment can be obtained. In addition, since the soft magnetic films 71, 72, and 73 are provided on the wirings 66, 67, and 69, the leakage field from the MTJ element 10 can be absorbed. Hence, the influence on adjacent cells can be reduced.

[3] Application of Magnetoresistive Random Access Memory

The memory cell structure of the above-described magnetoresistive random access memory according to an embodiment of the present invention can be applied to various types.

(a) Application Example 1

FIG. 19 is a block diagram showing the digital subscriber line (DSL) data path portion of a DSL modem as Application Example 1 of a magnetoresistive random access memory according to an embodiment of the present invention. Application Example 1 will be described below.

As shown in FIG. 19, this modem includes a programmable digital signal processor (DSP) 100, analog/digital (A/D) converter 110, digital/analog (D/A) converter 120, transmission driver 130, and receiver amplifier 140.

FIG. 19 illustrates no bandpass filter. Instead, optional memories of various types to hold a line code program (a program which is executed by the DSP to select and operate a modem in accordance with encoded subscriber line information and transmission conditions (line code; QAM, CAP, RSK, FM, AM, PAM, DWMT, and the like)) are provided. As this memory, a magnetoresistive random access memory (MRAM) 170 described above and an electrically erasable programmable ROM (EEPROM) 180 are shown.

In Application Example 1, two kinds of memories, i.e., the magnetoresistive random access memory 170 and EEPROM 180 are used as memories to hold the line code program. The EEPROM 180 may be replaced with an MRAM. That is, instead of using two types of memories, only MRAMs may be used.

(b) Application Example 2

FIG. 20 is a block diagram showing a part to implement a communication function in a cellular phone terminal as Application Example 2 of a magnetoresistive random access memory according to an embodiment of the present invention.

As shown in FIG. 20, a communication unit 200 to implement a communication function comprises a transmitting/receiving antenna 201, an antenna multiplexer 202, a receiving unit 203, a baseband processing unit 204, a digital signal processor (DSP) 205 used as a voice codec, a loudspeaker (receiver) 206, a microphone (transmitter) 207, a transmitting unit 208, and a frequency synthesizer 209.

A cellular phone terminal 300 has a control unit 220 which controls the units of the cellular phone terminal. The control unit 220 is a microcomputer which is formed by connecting a central processing unit (CPU) 221, a ROM 222, a magnetoresistive random access memory (MRAM) 223 according to the above embodiment and Application Example 1, and a flash memory 224 through a CPU bus 225. The ROM 222 stores, in advance, programs to be executed by the CPU 221 and necessary data such as fonts to be displayed.

The MRAM 223 is mainly used as a work area where the CPU 221 stores, as needed, data midway through calculation during executing the program, or data exchanged between the control unit 220 and the respective units are temporarily stored. Even when the cellular phone terminal 300 is powered off, the flash memory 224 stores, e.g., the immediately preceding set conditions, so the same set conditions can be used when the cellular phone terminal is powered on again. Accordingly, even when the cellular phone terminal is powered off, the stored set parameters are not erased.

The cellular phone terminal 300 also has an audio data reproduction processing unit 211, an external output terminal 212, a liquid crystal display (LCD) controller 213, an LCD 214 for display, and a ringer 215 which generates a ringing tone. The audio data reproduction processing unit 211 reproduces audio data input to the cellular phone terminal 300 (or audio data stored in an external memory 240 (to be described later)). The reproduced audio data can be transmitted to a headphone or a portable loudspeaker through the external output terminal 212 and extracted to the outside. The LCD controller 213 receives display information from, e.g., the CPU 221 through the CPU bus 225 and converts the display information into LCD control information to control the LCD 214. By this control information, the LCD 214 is driven to display information.

The cellular phone terminal 300 also has interface circuits (I/Fs) 231, 233, and 235, external memory 240, external memory slot 232, key operation unit 234, and external input/output terminal 236. The external memory slot 232 receives the external memory 240 such as a memory card. The external memory slot 232 is connected to the CPU bus 225 through the interface circuit 231. As described above, when the slot 232 is provided in the cellular phone terminal 300, information in the cellular phone terminal 300 can be written in the external memory 240. Alternatively, information (e.g., audio data) stored in the external memory 240 can be input to the cellular phone terminal 300. The key operation unit 234 is connected to the CPU bus 225 through the interface circuit 233. Key input information input from the key operation unit 234 is transmitted to, e.g., the CPU 221. The external input/output terminal 236 is connected to the CPU bus 225 through the interface circuit 235 and functions as a terminal in inputting various kinds of external information to the cellular phone terminal 300 or outputting information externally from the cellular phone terminal 300.

In Application Example 2, the ROM 222, MRAM 223, and flash memory 224 are used. Both the flash memory 224 and the ROM 222 or one of them may be replaced with an MRAM.

(c) Application Example 3

FIG. 21 shows Application Example 3 which applies a magnetoresistive random access memory according to an embodiment of the present invention to an electronic card (MRAM card) such as a smart medium to store media contents.

As shown in FIG. 21, an MRAM card main body 400 incorporates an MRAM chip 401. An opening portion 402 is formed in the card main body 400 at a position corresponding to the MRAM chip 401 so the MRAM chip 401 is exposed. The opening portion 402 has a shutter 403. When the MRAM card is carried, the MRAM chip 401 is protected by the shutter 403. The shutter 403 is made of a material such as a ceramic capable of shielding an external magnetic field. When data is to be transferred, the shutter 403 is opened to expose the MRAM chip 401. An external terminal 404 is used to extract content data stored in the MRAM card.

FIGS. 22 and 23 are plan and sectional views, respectively, showing a card insertion type data transfer device (electronic device) to transfer data to the MRAM card in FIG. 21.

As shown in FIGS. 22 and 23, a data transfer device 500 has a storage portion 500a. A first MRAM card 550 is stored in the storage portion 500. The storage portion 500a has an external terminal 530 electrically connected to the first MRAM card 550. Data on the first MRAM card 550 is rewritten by using the external terminal 530.

A second MRAM card 450 used by an end user is inserted from an insertion portion 510 of the transfer device 500 and pushed in until the card abuts against a stopper 520. The stopper 520 is also used as a member to align the first MRAM 550 and second MRAM card 450. When the second MRAM card 450 is located at a predetermined position, the data rewrite control unit of the first MRAM card 550 supplies a data rewrite control signal to the external terminal 530 to transfer data stored in the first MRAM card 550 to the second MRAM card 450.

FIG. 24 is a sectional view showing a fitting type data transfer device to transfer data to the MRAM card in FIG. 21. The fitting type data transfer device will be described below.

As shown in FIG. 24, in the fitting type data transfer device, the second MRAM card 450 is fitted on the first MRAM 550 with reference to the stopper 520, as indicated by the arrow in FIG. 21. The transfer method is the same as in the above-described card insertion type, and a description thereof will be omitted.

FIG. 25 is a sectional view showing a slide type data transfer device to transfer data to the MRAM card in FIG. 21. The slide type data transfer device will be described below.

As shown in FIG. 25, the slide type data transfer device 500 has a sliding tray 560, like a CD-ROM drive or DVD drive. The sliding tray 560 moves, as indicated by the arrow in FIG. 22. When the sliding tray 560 moves to the position indicated by the broken line in FIG. 22, the second MRAM card 450 is mounted on the sliding tray 560 and conveyed into the data transfer device 500. The structure that conveys the second MRAM card 450 until it abuts against the stopper 520 and the transfer method are the same as in the above-described card insertion type, and a description thereof will be omitted.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetoresistive element which records information by supplying spin-polarized electrons to a magnetic material, comprising:

a first pinned layer which is made of a magnetic material and has a first magnetization directed in a direction perpendicular to a film surface;

a free layer which is made of a magnetic material and has a second magnetization directed in the direction perpendicular to the film surface, the direction of the second magnetization reversing by the spin-polarized electrons;

a first nonmagnetic layer which is provided between the first pinned layer and the free layer;

a first magnetic metal layer which is provided between the first pinned layer and the first nonmagnetic layer and contains at least one element selected from the group consisting of Fe, Co, and Ni; and a second magnetic metal layer which is provided between the free layer and the first nonmagnetic layer and contains at least one element selected from the group consisting of Fe, Co, and Ni, wherein the second magnetic metal layer is thinner than the first magnetic metal layer, at least one of the first magnetic metal layer and the second magnetic metal layer is made of a ferromagnetic alloy containing at least one element selected from the group consisting of Fe, Co, and Ni and at least one element selected from the group consisting of B, Nb, Zr, Ta, V, and W, and a crystal structure of the ferromagnetic alloy is a bcc structure.

2. The element according to claim 1, further comprising:
a second pinned layer which is made of a magnetic material and has a third magnetization directed in the direction perpendicular to the film surface; and
a second nonmagnetic layer which is provided between the second pinned layer and the free layer.

3. The element according to claim 1, which further comprises:
a second pinned layer which is made of a magnetic material and has a third magnetization directed in the direction perpendicular to the film surface; and
a second nonmagnetic layer which is provided between the second pinned layer and the free layer; and
in which a first magnetoresistive ratio generated between the free layer and the first pinned layer through the first nonmagnetic layer is larger than a second magnetoresistive ratio generated between the free layer and the second pinned layer through the second nonmagnetic layer.

4. The element according to claim 2, wherein the first nonmagnetic layer and the second nonmagnetic layer are made of an insulator and the element has a tunneling magnetoresistive effect.

5. The element according to claim 1, wherein
at least one of the layers made of the magnetic material comprises a first magnetic layer, a second magnetic layer, and a third nonmagnetic layer which is provided between the first magnetic layer and the second magnetic layer, and
the first magnetic layer and the second magnetic layer are antiferromagnetically coupled to each other.

6. The element according to claim 1, wherein at least one of the layers made of the magnetic material is made of an alloy having Co as a principal component and containing at least one element selected from the group consisting of Cr, Ta, Nb, V, W, Hf, Ti, Zr, Pt, Pd, Fe, and Ni.

7. The element according to claim 1, wherein at least one of the layers made of the magnetic material is made of an alloy containing at least one element selected from the group consisting of Fe, Co, and Ni and at least one element selected from the group consisting of Pt and Pd, the alloy being an ordered alloy with an $L1_0$ crystal structure.

8. The element according to claim 1, wherein at least one of the layers made of the magnetic material has a structure in which a first layer and a second layer are alternately stacked, the first layer is made of an element selected from the first group consisting of Fe, Co, and Ni or an alloy containing at least one element selected from the first group, and the second layer is made of an element selected from the second group consisting of Cr, Pt, Pd, Ir, Rh, Ru, Os, Re, Au, and Cu or an alloy containing at least one element selected from the second group.

9. The element according to claim 1, wherein at least one of the layers made of the magnetic material is made of a ferrimagnetic material containing an alloy of a rare-earth metal and a transition metal.

10. The element according to claim 1, wherein at least one of the layers made of the magnetic material has a structure in which a magnetic portion and a nonmagnetic portion are separated by segregating the nonmagnetic portion.

11. The element according to claim 1, wherein
the free layer includes a first magnetic layer having a first magnetic moment and a second magnetic layer having a second magnetic moment,
the first magnetic layer is made of a ferrimagnetic material containing an alloy of a first rare-earth metal and a first transition metal, a magnetic moment of the first rare-earth metal is larger than a magnetic moment of the first transition metal, and the second magnetic layer is made of a ferromagnetic material containing an element of a second transition metal or an alloy having the element as a principal component, and
the first magnetic moment and second magnetic moment cancel each other.

12. The element according to claim 1, wherein
the free layer and the second magnetic metal layer are exchange-coupled to each other,
a damping constant of the second magnetic metal layer is smaller than a damping constant of the free layer.

13. The element according to claim 12, wherein at least one of the free layer and the second magnetic metal layer has a granular structure in which a magnetic material is dispersed.

14. The element according to claim 1, wherein
the free layer includes a first magnetic material and a second magnetic material,
the first magnetic material is dispersed in the second magnetic material, and
a damping constant of the first magnetic material is smaller than a damping constant of the second magnetic material.

15. The element according to claim 1, wherein
the free layer includes a first magnetic material and a second magnetic material,
the second magnetic material is dispersed in the first magnetic material, and
a damping constant of the second magnetic material is larger than a damping constant of the first magnetic material.

16. The element according to claim 14, wherein the second magnetic material is an alloy having an $L1_0$ structure and mainly containing one of Fe—Pt, Fe—Pd, Co—Pt, Co—Pd, and Mn—Al.

17. The element according to claim 14, wherein the first magnetic material is an alloy containing at least Fe whose content is at least 40 at %.

18. The element according to claim 14, wherein the free layer includes an ordered alloy having an $L1_0$ structure and mainly containing one of Fe—Pt, Fe—Pd, Co—Pt, Co—Pd, and Mn—Al.

19. A magnetoresistive random access memory comprising:
the magnetoresistive element according to claim 1; and
a write wiring which gives a current of the spin-polarized electrons to the magnetoresistive element.

20. A magnetoresistive random access memory comprising:
the magnetoresistive element according to claim 1;
a write wiring which gives a current of the spin-polarized electrons to the magnetoresistive element; and
a soft magnetic film which covers at least part of the write wiring and absorbs a magnetic field leaked from the magnetoresistive element.

21. A magnetoresistive random access memory comprising:
the magnetoresistive element according to claim 1;
a write wiring which gives a current of the spin-polarized electrons to the magnetoresistive element; and
a first soft magnetic film and a second soft magnetic film which sandwich the magnetoresistive element from a direction of thickness and absorbs a magnetic field leaked from the magnetoresistive element.

22. An electronic card comprising:
a semiconductor chip having the magnetoresistive element according to claim 1;
a card portion which stores the semiconductor chip and has a window to expose the semiconductor chip;
a shutter which opens/closes the window and is made of a material having a magnetic shielding effect; and
a terminal which is provided in the card portion to electrically connect the semiconductor chip to an outside of the card portion.

23. A data transfer device comprising:
a storage portion which stores the electronic card according to claim 22; and
a terminal which is provided in the storage portion and electrically connected to the electronic card to supply a signal which controls a data rewrite of the electronic card.

* * * * *